United States Patent
Awano

(10) Patent No.: US 10,798,857 B2
(45) Date of Patent: Oct. 6, 2020

(54) FILTER HOLDING STRUCTURE AND COMPONENT MOUNTING APPARATUS

(71) Applicant: YAMAHA HATSUDOKI KABUSHIKI KAISHA, Shizuoka (JP)

(72) Inventor: Yukinari Awano, Shizuoka (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 326 days.

(21) Appl. No.: 15/756,132

(22) PCT Filed: Sep. 17, 2015

(86) PCT No.: PCT/JP2015/076507
§ 371 (c)(1),
(2) Date: Feb. 28, 2018

(87) PCT Pub. No.: WO2017/046918
PCT Pub. Date: Mar. 23, 2017

(65) Prior Publication Data
US 2018/0249607 A1    Aug. 30, 2018

(51) Int. Cl.
*H05K 13/04* (2006.01)
*B01D 46/00* (2006.01)

(52) U.S. Cl.
CPC ..... *H05K 13/0408* (2013.01); *B01D 46/0005* (2013.01); *H05K 13/0409* (2018.08); *B01D 2279/00* (2013.01)

(58) Field of Classification Search
CPC .............. H05K 13/04; H05K 13/0409; H05K 13/0408; B01D 46/0005; B01D 2279/00
See application file for complete search history.

(56) References Cited

U.S. PATENT DOCUMENTS 6,527,322 B2 * 3/2003 Suhara ............... H05K 13/0409
294/185

FOREIGN PATENT DOCUMENTS

| JP | S62-107991 A | 5/1987 |
|---|---|---|
| JP | 2001-198872 A | 7/2001 |
| JP | 2002-301677 A | 10/2002 |
| JP | 3878816 B2 | 2/2007 |
| JP | 2008-034410 A | 2/2008 |
| JP | 4618204 B2 | 1/2011 |
| JP | 5210904 B2 | 6/2013 |

OTHER PUBLICATIONS

International Search Report issued in PCT/JP2015/076507; dated Dec. 22, 2015.

* cited by examiner

*Primary Examiner* — Carl J Arbes
(74) *Attorney, Agent, or Firm* — Studebaker & Brackett PC

(57) ABSTRACT

In a filter holding structure for holding a filter in a component suction head in which a suction nozzle is detachably attached to a tip part of a nozzle shaft, a filter holding space for holding the filter and an opening allowing communication between the filter holding space and the suction nozzle are provided in a tip part of the nozzle shaft. Also, a communication region of the filter holding space connected to the opening is made narrower than an end surface of the filter on the suction nozzle side and is held in the tip part of the nozzle shaft.

6 Claims, 16 Drawing Sheets

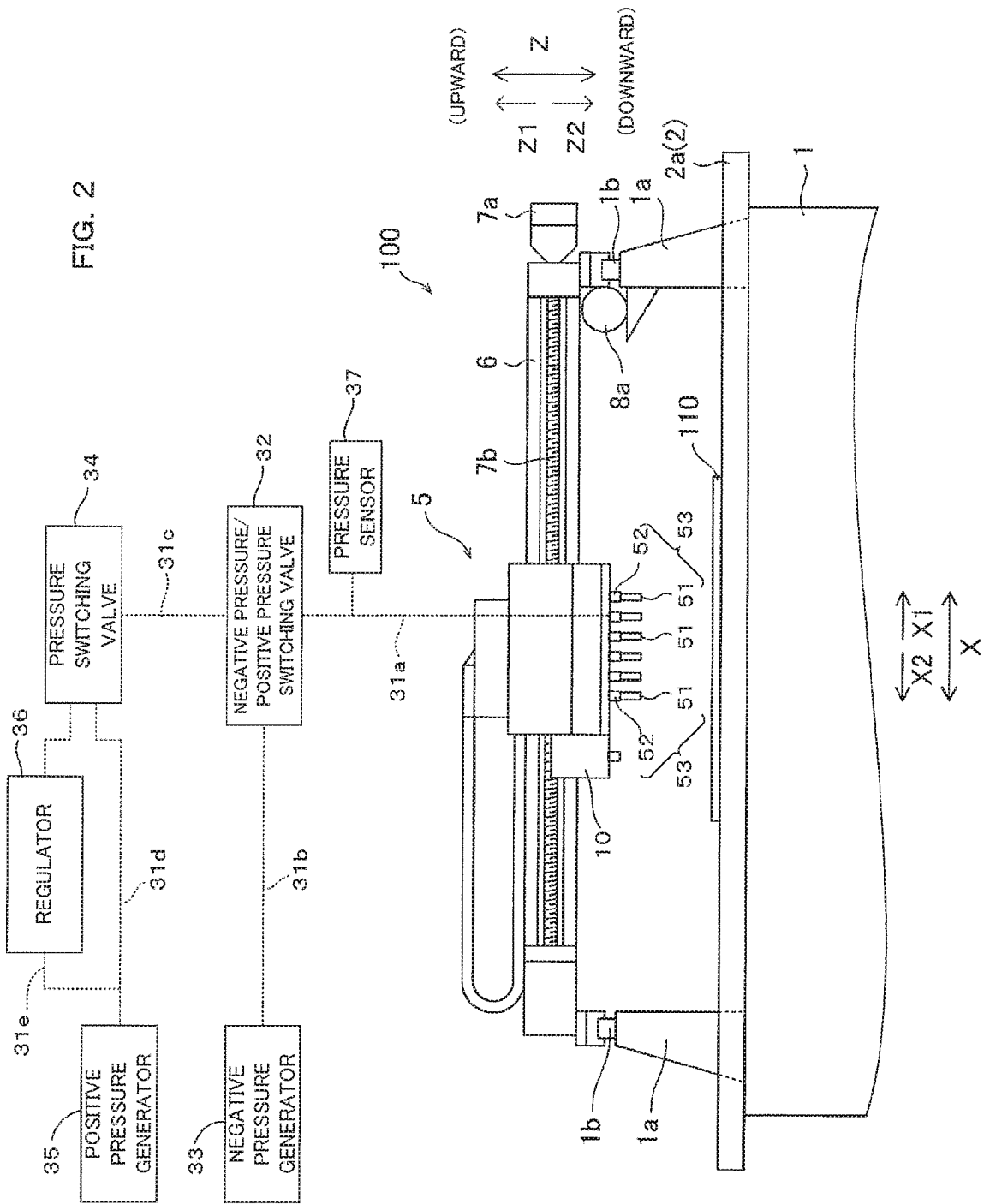

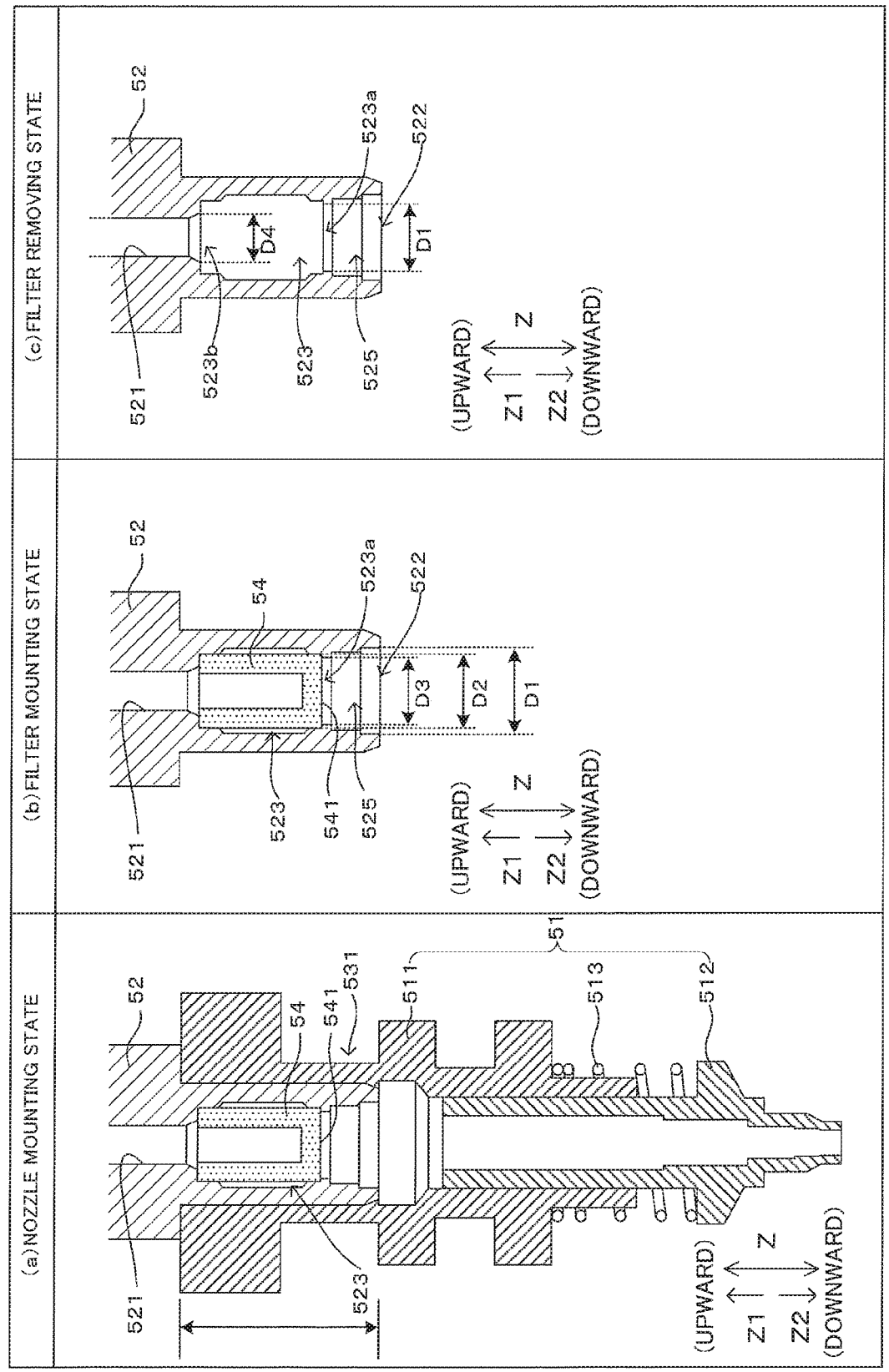

| (a) DESCEND SHAFT | (b) HOLD BY SUCTION | (c) MOVE TO FILTER MOUNTING/REMOVING UNIT |
|---|---|---|

_US 10,798,857 B2_

FILTER HOLDING STRUCTURE AND COMPONENT MOUNTING APPARATUS

CROSS-REFERENCE TO RELATED APPLICATION

This application claims benefit of priority to International Patent Application No. PCT/JP2015/076507, filed Sep. 17, 2015, the entire content of which is incorporated herein by reference.

BACKGROUND

Technical Field

This disclosure relates to a filter holding structure for holding a filter inside a component suction head for sucking a component and a component mounting apparatus having this filter holding structure.

Background Art

In a component mounting apparatus for mounting a component supplied from a component supply unit such as a tape feeder to a substrate, a component suction head is used to pick up the component from the component supply unit and then mount on the substrate. The component suction head is configured such that a suction nozzle is attached to a tip part of a nozzle shaft, and sucks the component by the suction nozzle by giving a negative pressure to the suction nozzle via a conduit provided inside the nozzle shaft. Further, in the component suction head, a filter is arranged in a negative pressure path to remove foreign matters. For example, in a device described in Japanese Patent No. 3878816, a suction hole extends toward a suction nozzle inside a nozzle block equivalent to the above nozzle shaft. A filter unit having a filter fixed inside a hollow cylindrical holder is mounted in the suction hole.

SUMMARY

In the above conventional technology, the filter needs to be mounted into the nozzle block while being accommodated in the holder, whereby an inner diameter of the suction hole becomes larger. Thus, the enlargement of the nozzle block and, eventually, the enlargement of the component suction nozzle in a direction perpendicular to an extending direction of the suction hole are unavoidable and a head interval in arranging a plurality of component suction heads side by side becomes wider. This has been one of main causes for reducing operation efficiency of the component mounting apparatus.

Further, in the above conventional technology, an externally threaded portion is provided on the outer periphery of the holder and the filter unit is mounted in the nozzle block by threadably engaging the externally threaded portion with an internal thread provided in the suction hole. Thus, three mounting operations including the insertion of the filter into the holder, the fixing of the filter by a ring member and the mounting of the filter unit (holder+filter+ring member) into the nozzle block need to be performed to mount the filter into the nozzle block.

This disclosure was developed in view of the above problems and aims to provide a filter holding structure facilitating the mounting of a filter into a component suction nozzle while avoiding the enlargement of the component suction nozzle and a component mounting apparatus having this filter holding structure.

One aspect of the present disclosure is a filter holding structure for holding a filter in a component suction head in which a suction nozzle is detachably attached to a tip part of a nozzle shaft. In the filter holding structure, a filter holding space for holding the filter and an opening allowing communication between the filter holding space and the suction nozzle are provided in a tip part of the nozzle shaft; and a communication region of the filter holding space connected to the opening is made narrower than an end surface of the filter on the suction nozzle side and is held in the tip part of the nozzle shaft.

Another aspect of the present disclosure is a component mounting apparatus for holding and mounting a component on a substrate by a component suction head in which a suction nozzle is detachably attached to a tip part of a nozzle shaft. In the component mounting apparatus, a filter holding space for holding the filter and an opening allowing communication between the filter holding space and the suction nozzle are provided in a tip part of the nozzle shaft; and a communication region connected to the opening, out of the filter holding space, is made narrower than an end surface on the suction nozzle side of the filter located in the filter holding space and is held in the tip part of the nozzle shaft.

In the thus configured disclosure, the suction nozzle is detachably attached to the tip part of the nozzle shaft and communicates with the filter holding space via the opening provided in the tip part of the nozzle shaft. The filter is singly accommodated in this filter holding space. In addition, the communication region of the filter holding space connected to the opening is made narrower than the end surface of the filter on the suction nozzle size. Thus, the filter can be firmly held without dropping through the above opening.

As described above, since the filter can be singly directly mounted in the tip part of the nozzle shaft and reliably held in the disclosure, the filter can be easily mounted. Further, an increase in the diameter of the nozzle shaft associated with the mounting of the filter can be prevented, with the result that the enlargement of the component suction head associated with the mounting of the filter can be avoided.

BRIEF DESCRIPTION OF THE DRAWINGS

FIG. 2 is a front view of the component mounting apparatus shown in FIG. 1;

FIG. 3 is a diagram showing the configurations of the suction nozzle and the nozzle shaft;

DETAILED DESCRIPTION

A. First Embodiment

Figure 1:
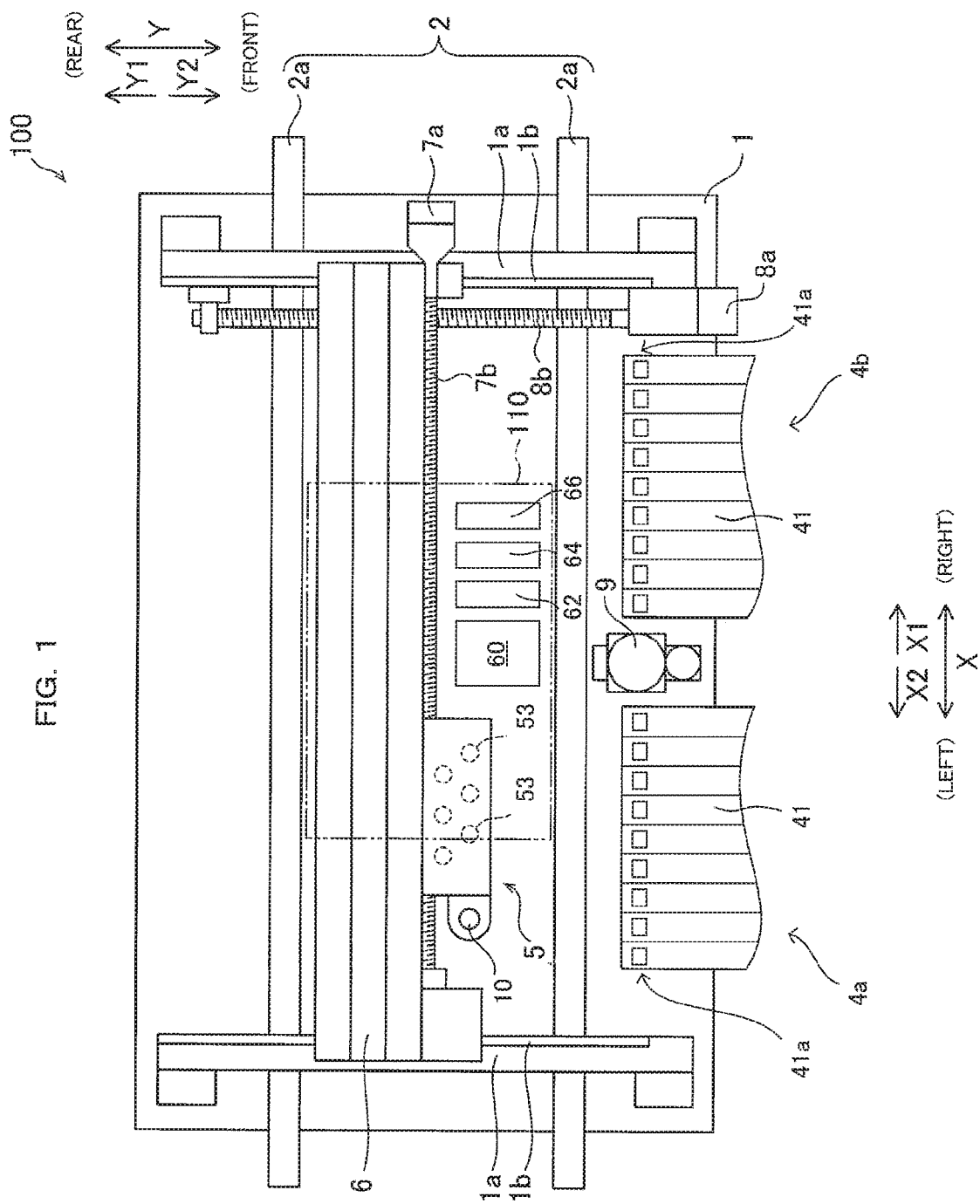
FIG. 1 is a plan view showing a first embodiment of a component mounting apparatus according to the disclosure.

FIG. 1 is a plan view showing a first embodiment of a component mounting apparatus according to the disclosure. Further, FIG. 2 is a front view of the component mounting apparatus shown in FIG. 1. This component mounting apparatus 100 includes, as shown in FIGS. 1 and 2, a base 1, a substrate conveying mechanism 2 arranged on the base 1 for conveying a substrate 110 in an X direction, component storages 4a, 4b in which component supply units 41 for supplying components are removably mounted, and a head unit 5 for component mounting.

The substrate conveying mechanism 2 includes a pair of conveyors 2a extending in a conveying direction (X direction) of the substrate 110. The pair of conveyors 2a are configured to receive the substrate 110 from an X1 direction side, convey the substrate 110 to a predetermined mounting operation position and carry out the substrate 110 finished with a mounting operation to an X2 direction side after the mounting operation.

The component storages 4a, 4b are arranged on a front side (Y2 direction side) of the substrate conveying mechanism 2 while being spaced apart from each other in the X direction. In these component storages 4a, 4b, a plurality of component supply units 41 are provided. In this embodiment, tape feeders 41 storing chip components such as ICs, transistors and capacitors are used as examples of the component supply units. In each component supply unit 4a, 4b, a plurality of tape feeders 41 are arranged in the X direction along the substrate conveying mechanism 2. In the component supply unit 4a, 4b, each tape feeder 41 is configured to supply the chip component to a predetermined component supply position 41a near the substrate conveying mechanism 2 while intermittently feeding a tape. Note that mounted positions of these tape feeders 41 on each component supply unit 4a, 4b can be arbitrarily changed by an operator or the like.

The head unit 5 has a function of sucking the components supplied from the component storages 4a, 4b via suction nozzles 51 to be described later and mounting the components on the substrate 110. The head unit 5 is configured to be movable in the conveying direction (X direction) of the substrate 110 and a front-rear direction (Y direction). Specifically, the head unit 5 is supported movably in the X direction by a unit supporting member 6 extending in the X direction. Further, the head unit 5 is moved in the X direction by the rotation of a ball screw shaft 7b by an X-axis motor 7a. The unit supporting member 6 is supported movably in the Y direction by a pair of elevated frames 1a via a pair of fixing rails 1b extending in the Y direction. The unit supporting member 6 is moved in the Y direction by the rotation of a ball screw shaft 8b by a Y-axis motor 8a.

Figure 6:
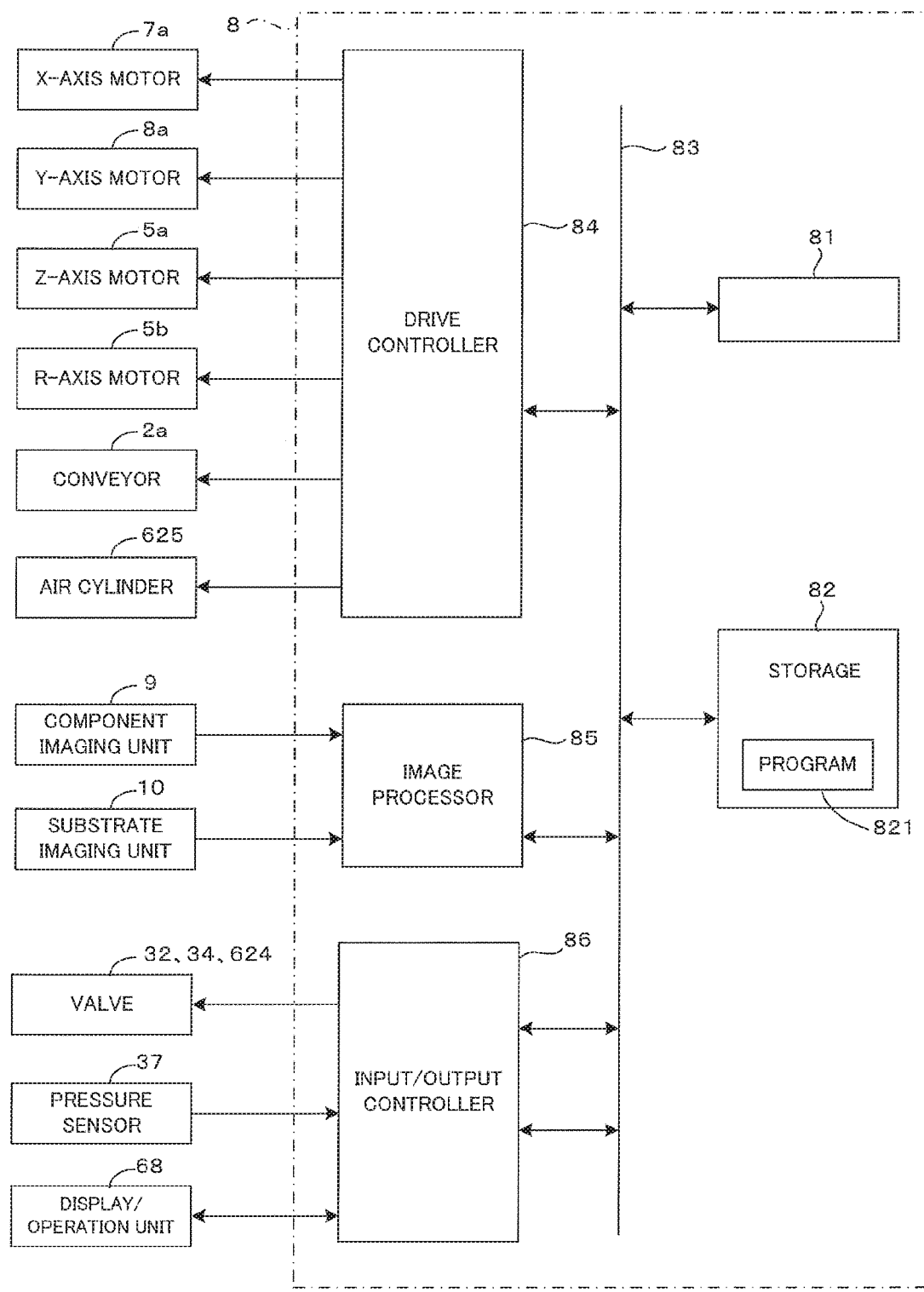
FIG. 6 is a block diagram showing an electrical configuration of the component mounting apparatus of FIG. 1.

Further, the head unit 5 includes a plurality of component suction heads 53 each having a rear end part of the suction nozzle 51 for component suction detachably attached to a tip part of a nozzle shaft 52. Each component suction head 53 is configured to be movable upward and downward (movements in a Z direction) by a Z-axis motor 5a (FIG. 6) and rotatable in an R direction with a vertical axis passing through a center of the suction nozzle 51 as a center of rotation by an R-axis motor 5b (FIG. 6). Six component suction heads 53 are provided, and three component suction heads 53 are arranged in each of two front and rear rows. Further, one suction nozzle 51 is attached to each component suction head 53. Similar to the component suction heads 53, three suction nozzles 51 are arranged in each of two front and rear rows. Specifically, three out of six suction nozzles 51 are offset in the Y direction from the remaining three as shown in FIG. 1.

In FIG. 3, a state where the suction nozzle 51 is attached to the nozzle shaft 52 is shown in column (a) of FIG. 3, a state where the suction nozzle 51 is detached from the nozzle shaft 52 is shown in column (b) of FIG. 3 and a state where a filter 54 is removed from the nozzle shaft 52 is shown in column (c) of FIG. 3. The suction nozzle 51 includes a nozzle holder 511, having a rear end part 531, to be externally fitted on a tip part of the nozzle shaft 52, a nozzle body 512 held vertically movably on a tip part of this nozzle holder 511 and a compression coil spring 513 for biasing the nozzle body 512 downwardly (in a direction to project from the nozzle holder 511). Each of the nozzle holder 511 and the nozzle body 512 is provided with a conduit penetrating in a vertical direction. When the nozzle holder 511 is externally fitted on the tip part of the nozzle shaft 52 by a length L1, the above conduit communicates with a conduit 521 extending in the vertical direction in the nozzle shaft 52, thereby forming a blowing path and a suction path. The blowing path is for blowing the compressed air to the component, the compressed filter and the like by giving compressed air to the tip part of the suction nozzle 51. The suction path is for giving a negative pressure as a suction force to the tip part of the suction nozzle 51.

To give positive and negative pressures to the suction nozzle 51 as described above, a switching valve described next is provided for each component suction head 53. Specifically, as shown in FIG. 2, the nozzle shaft 52 of each component suction head 53 is connected to a negative pressure/positive pressure switching valve 32 by a pipe 31a. Besides the pipe 31a, pipes 31b, 31c are connected to this negative pressure/positive pressure switching valve 32. Out of these, the pipe 31b is connected to a negative pressure generator 33 constituted by a vacuum pump or the like. Thus, the negative pressure/positive pressure switching valve 32 connects the pipe 31a only to the pipe 31b while a switching signal given to the negative pressure/positive pressure switching valve 32 from a control unit 8 for controlling the entire apparatus is set at a negative pressure level. In this way, a negative pressure is supplied to the suction nozzle 51 via the suction path configured by the pipe 31a, the negative pressure/positive pressure switching valve 32, the pipe 31b and the conduit 521 of the nozzle shaft 52. On the other hand, if the above switching signal is switched to a positive pressure level, the negative pressure/positive pressure switching valve 32 switches a connection destination of the pipe 31a from the pipe 31b to the pipe 31c. Note that a pressure sensor 37 is mounted in the pipe 31a, detects a pressure given to the conduit 521 of the nozzle shaft 52 and outputs the detected pressure to the control unit 8.

The pipe 31c is connected to a pressure switching valve 34. Besides the pipe 31c, pipes 31d, 31e are connected to this pressure switching valve 34. Out of these, the pipe 31d is directly connected to a positive pressure generator 35 constituted by a compressor or the like and supplies compressed air having a relatively high pressure generated in the positive pressure generator 35. The other pipe 31e is a branch pipe branched from the pipe 31d, and a regulator 36 is inserted in an intermediate part of the pipe 31e. This regulator 36 has a function of reducing the pressure of the compressed air flowing thereinto via the pipes 31d, 31e to a pressure suitable for a component mounting process. Air regulated to a low pressure by the regulator 36 is supplied toward the pressure switching valve 34 by the pipe 31e.

The pressure switching valve 34 switches a connected state between the pipe 31c and the pipe 31d, 31e according to a switching signal from the control unit 8. More specifically, while the switching signal is set at a "high-pressure" level, the pressure switching valve 34 switches to a state where the pipe 31d is connected to the pipe 31c, i.e. a "high-pressure connection state". On the other hand, if the above switching signal is switched to a "low-pressure" level, the pressure switching valve 34 switches the connection destination of the pipe 31c from the pipe 31d to the pipe 31e. That is, the pressure switching valve 34 switches to a "low-pressure connection state" where the pipe 31e is connected to the pipe 31c. Thus, while the negative pressure/positive pressure switching valve 32 is switched to a positive pressure supply side, the positive pressure is supplied to the suction nozzle 51 via the pipe 31c, the negative pressure/positive pressure switching valve 32 and the pipe 31a. In addition, the pressure of the air supplied to the suction nozzle 51 by the switch of the connection state by the pressure switching valve 34 can be adjusted to two types and those positive pressures are supplied by the compressed air to the suction nozzle 51 via the blowing path constituted by the pipe 31c, the negative pressure/positive pressure switching valve 32 and the conduit 521 of the nozzle shaft 52.

The suction nozzle 51 configured as described above is detachably attached to the tip part of the nozzle shaft 52. When the suction nozzle 51 is detached, a filter holding space 523 of the nozzle shaft 52 communicates with outside via an opening 522 formed in the tip surface of the nozzle shaft 52. Further, this opening 522 exhibits a function of allowing communication between the nozzle holder 511 of the suction nozzle 51 and the filter holding space 523 when the suction nozzle 51 is attached to the nozzle shaft 52.

Further, the opening 522 communicates with the filter holding space 523 via a passage 525 extending in the Z direction. Although an inner diameter D1 of the opening 522 is set to be slightly larger than an outer diameter D2 of the filter 54 in this embodiment, an inner diameter of the passage 525 becomes narrower toward the filter holding space 523. Further, although a communication region 523a of the filter holding space 523 is connected to the opening 522 via the passage 525, an inner diameter D3 of this communication region 523a is set to be slightly smaller than the outer diameter D2 of the filter 54 in this embodiment. Thus, by bringing a rear end part (Z1 side end part) of the filter 54 into contact with the tip part of the nozzle shaft 52 and pressing a front end surface 541 of the filter 54 upwardly (Z1 direction) by a cylindrical member of a filter removal unit as described later, the filter 54 can be press-fitted into the filter holding space 523 via the opening 522 and held in the filter holding space 523. Particularly, in this embodiment, the passage 525 and the opening 522 are widened in a horn shape and the filter 54 is easily press-fitted when a tip side (Z2 direction side) is viewed from the communication region 523a. Note that the filter 54 needs to be maintained within an elastically deformable range, i.e. within the range of elasticity limit to press-fit the filter 54 and hold the filter 54 in the filter holding space 523. Thus, a difference (=D2−D3) between the inner diameter D3 of the communication region 523a and the outer diameter D2 of the filter 54 is desirably set such that stress given to the filter 54 at the time of press-fitting is equal to or below an elasticity limit.

On the other hand, after the press-fitting, a peripheral edge part of the lower surface of the filter 54 is locked in an area of the tip part of the nozzle shaft 52 surrounding the communication region 523a, and the filter 54 is firmly held in the filter holding space 523 also when the positive pressure is supplied. Further, also on a Z1 direction side of the filter holding space 523, an inner diameter D4 of a communication region 523b connected to the conduit 521 is slightly smaller than the outer diameter D2 of the filter 54. Thus, a peripheral edge part of the upper surface of the filter 54 is locked in an area of the tip part of the nozzle shaft 52 surrounding the communication region 523b, and the filter 54 is firmly held in the filter holding space 523 also when the negative pressure is supplied.

Further, in this embodiment, the filter holding space 523 is provided in an external fitting area (range of the length L1) of the suction nozzle 51 on the nozzle shaft 52 in the vertical direction Z and the filter 54 held in the filter holding space 523 is also located in the external fitting area as shown in column (a) of FIG. 3. In this way, the filter 54 is arranged, utilizing the external fitting area for attaching and detaching the suction nozzle 51 to and from the nozzle shaft 52. As a result, the elongation of the component suction head 53 due to the provision of the filter 54 inside can be effectively prevented. This is because a length of the component suction head 53 is affected by a filter holding position. For example, in the device described in Japanese Patent No. 3878816, the filter is held at a position distant from the area (area where a clamp member is disposed) for mounting the suction nozzle in the nozzle block (equivalent to the nozzle shaft of this embodiment). Thus, an area for holding the filter needs to be separately secured and the component suction head becomes longer by that much. In contrast, in this embodiment, since the area for holding the filter 54 and the area for detaching and attaching the suction nozzle 51 to and from the nozzle shaft 52 (external fitting area) completely overlap in the extending direction Z of the component suction head 53, the component suction head 53 can be shortened.

As just described, in this embodiment, a filter holding structure for press-fitting the filter 54 into the filter holding space 523 and holding the filter 54 in the filter holding space 523 is adopted for the component suction head 53. As shown in FIG. 1, a filter supply unit 62 for supplying the filter 54 is provided adjacent to a nozzle exchange unit 60 for exchanging the suction nozzle 51 by detaching and attaching the suction nozzle 51 from and to the tip part of the nozzle shaft 52. Further, a filter mounting/removing unit 64 is provided adjacent to the filter supply unit to mount the filter 54 supplied from the filter supply unit 62 into the nozzle shaft 52 and remove the used filter 54 from the nozzle shaft. Furthermore, a filter disposal box 66 for disposing of the used filter 54 removed by the filter mounting/removing unit 64 is provided adjacent to the filter mounting/removing portion 64. Note that although the nozzle exchange unit 60, the filter supply unit 62, the filter mounting/removing unit 64 and the filter disposal box 66 are arranged side by side in this order in the X1 direction as shown in FIG. 1 in this embodiment, these units can be arbitrarily arranged.

Figure 4A:
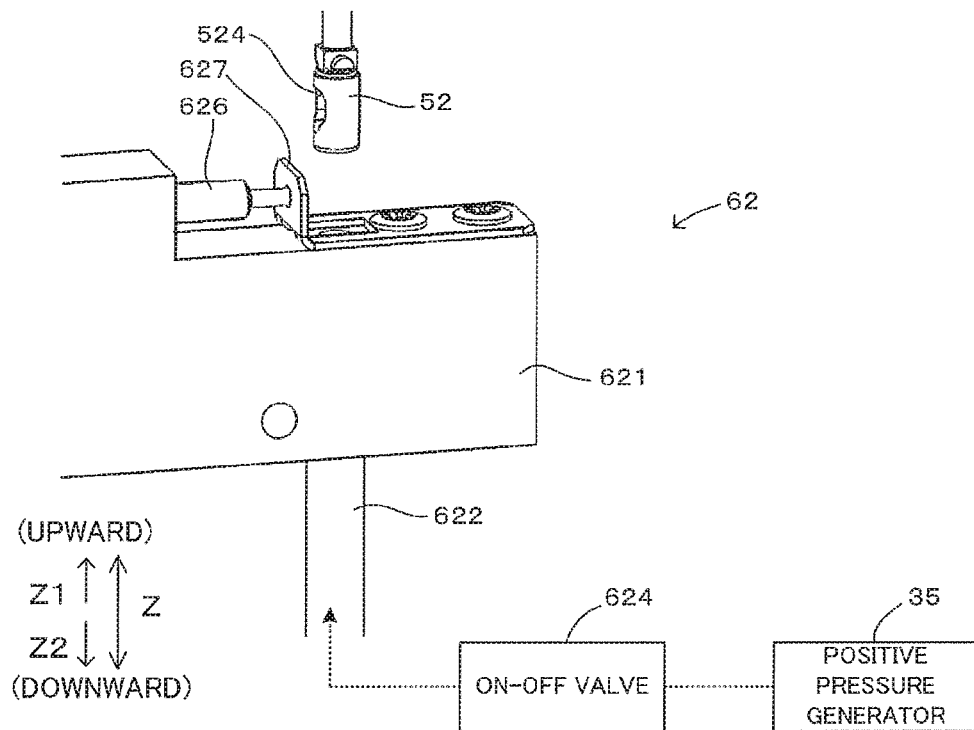
FIG. 4A is a diagram showing the configuration of the filter supply unit.
Figure 4B:
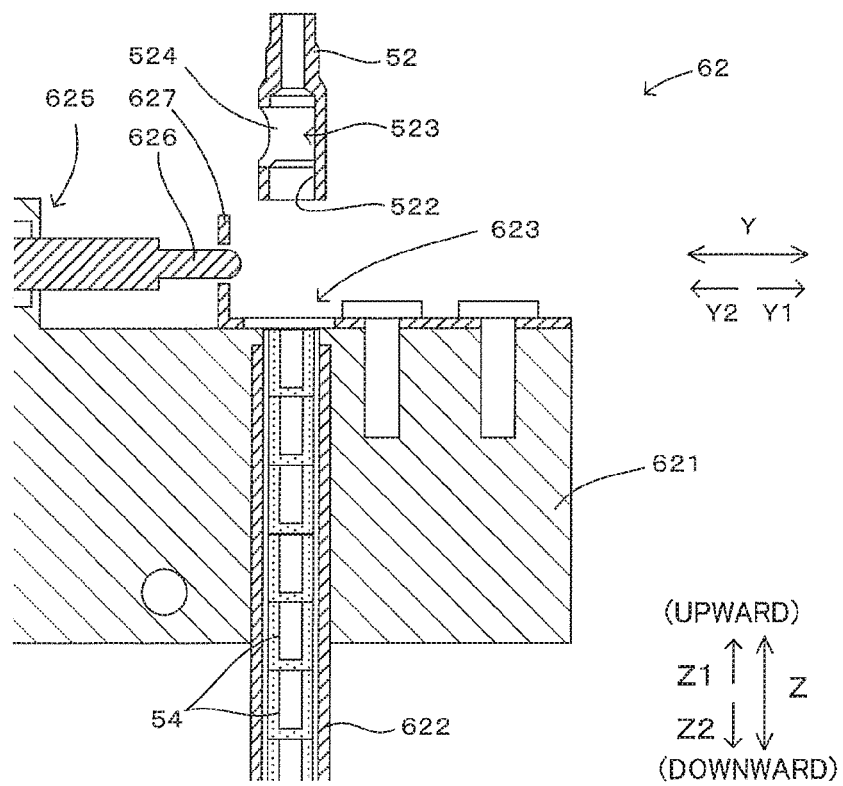
FIG. 4B is a partial sectional view of the filter supply unit.

FIG. 4A is a diagram showing the configuration of the filter supply unit and FIG. 4B is a partial sectional view of the filter supply unit. In the filter supply unit 62, a filter supply case 622 is detachably attached to a supply body 621. This filter supply case 622 accommodates a plurality of filters 54 arranged in a row and can guide the filter 54 subjected to high-pressure blowing by compressed air from the positive pressure generator 35 to a filter supply position 623. Note that reference sign 624 in FIG. 4A denotes an on-off valve, which is opened in response to an open command from the control unit 8 to supply the compressed air to a Z2 side end part of the filter supply case 622, thereby performing high-pressure blowing, and is closed in response to a close command to stop high-pressure blowing. In this way, the feed of the filter 54 in the Z1 direction and the stop of the feed are switched.

An air cylinder 625 and a filter positioning member 626 are arranged at a Y2 side of the filter supply position 623 as shown in FIG. 4B. The filter positioning member 626 is coupled to a piston (not shown) of the air cylinder 625 and moves back and forth relative to the filter supply position 623 along the Y direction by the operation of the air cylinder 625 in response to a movement command from the control unit 8. Here, various types of air cylinders can be used as the air cylinder 625, and a double-action air cylinder used in a seventh embodiment to be described later may be, for example, used. Further, when moving to the filter supply position 623, the filter positioning member 626 locks the filter 54 fed in the Z1 direction by high-pressure blowing, restricts any further upward movement of the filter 54 and positions the filter 54 in the vertical direction Z. At this time, the filter 54 located at an uppermost position out of the filters 54 accommodated in the filter supply case 622 is press-fitted into the nozzle shaft 52 by high-pressure blowing as described later. However, since it is difficult to press-fit the entire filter 54 into the filter holding space 523 of the nozzle shaft 52 only by high-pressure blowing and the tip of the filter positioning member 626 is present in the filter holding space 523 at this point of time, only a rear end part (Z1 side end part) of the filter 54 is press-fitted and held in the nozzle shaft 52 (hereinafter, this holding is referred to as "partial holding"). On the other hand, when the filter positioning member 626 retreats from the filter supply position 623, there is no more restriction on the filter 54 and the filter 54 can move. Note that reference sign 524 in FIGS. 4A and 4B denotes a filter discharge opening formed in a side surface of the tip part of the nozzle shaft 52 and reference sign 627 denotes a stopper for specifying the position of the tip of the filter positioning member 626 in the filter holding space 523.

Figure 5:
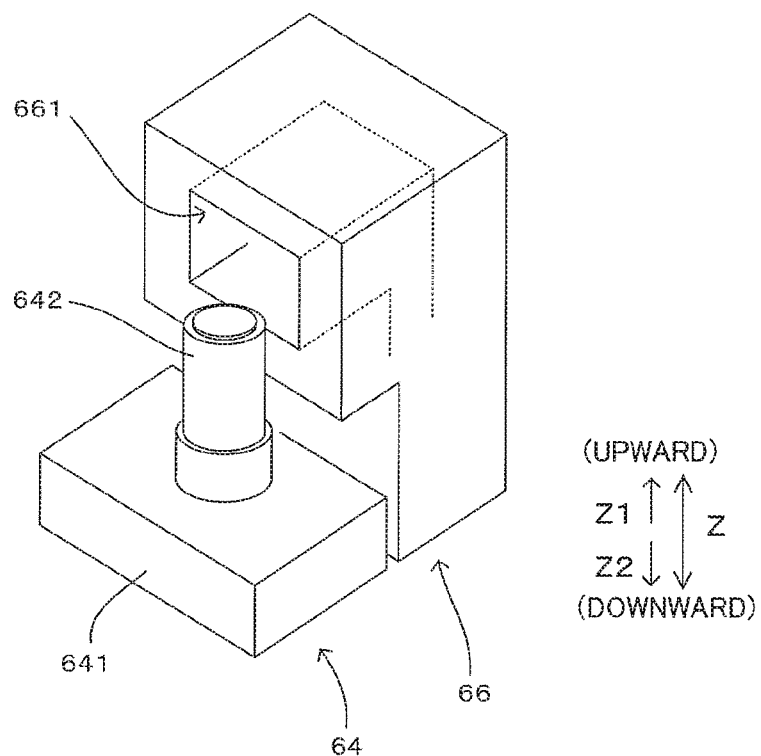
FIG. 5 is a diagram showing the configurations of the filter mounting/removing unit and the filter disposal box.

FIG. 5 is a diagram showing the configurations of the filter mounting/removing unit and the filter disposal box. In the filter mounting/removing unit 64, a cylindrical member 642 projects in the Z1 direction from the upper surface of a base member 641. An outer diameter of this cylindrical member 642 is slightly smaller than the inner diameter D3 (FIG. 3) of the communication region 523a and an end part of the cylindrical member 642 on a Z1 direction side can enter the filter holding space 523 via the communication region 523a. For example, if the nozzle shaft 52 descends in the Z2 direction, for example, in a state where the nozzle shaft 52 partially holding the filter 54 is positioned at a position right above the cylindrical member 642, the front end surface 541 of the filter 54 comes into contact with a top part of the cylindrical member 642. By a further descending movement of the nozzle shaft 52, the filter 54 is pressed in the Z1 direction by the cylindrical member 642 and press-fitted into the filter holding space 523. As just described, the cylindrical member 642 functions as a member for pressing the filter 54, i.e. as a "pressing member" and the filter mounting/removing unit 64 functions as a "filter mounting unit" of the disclosure, using this cylindrical member 642.

Further, the cylindrical member 642 also functions as a member for squeezing the filter 54 held in the filter holding space 523, i.e. as a "squeezing member" and the filter mounting/removing unit 64 also functions as a "filter removal unit" of the disclosure, using this cylindrical member 642. Specifically, if the nozzle shaft 52 descends in the Z2 direction in a state where the nozzle shaft 52 holding the filter 54 is positioned at the position right above the cylindrical member 642, the cylindrical member 642 enters the filter holding space 523 via the communication region 523a. In this way, the filter 54 is plastically deformed, specifically squeezed in the vertical direction Z to be compressed, in the filter holding space 523. Note that the filter 54 compressed in this way is drastically smaller in size than the filter holding space 523 and the compressed filter 54 is discarded into the filter disposal box 66 via the filter discharge opening 524 by high-pressure blowing caused by supplying the high-pressure compressed air to the conduit 521 of the nozzle shaft 52.

As shown in FIG. 5, the filter disposal box 66 is provided with a collection opening 661 facing the filter mounting/removing unit 64 and receives the compressed filter 54 discharged from the filter holding space 523 by high-pressure blowing via the collection opening 661. Note that although the filter disposal box 66 is configured to store the collected compressed filter 54 inside in this embodiment, the filter disposal box 66 may be configured to automatically convey the collected compressed filter 54 to another disposal box by giving a negative pressure to the inside of the filter disposal box 66 as adopted in the seventh embodiment to be described later.

Referring back to FIG. 1, the configuration of the component mounting apparatus 100 is further described. The component mounting apparatus 100 is provided with a component imaging unit 9 for imaging the components sucked by the head unit 5. The component imaging unit 9 has a function of recognizing a held state of the component taken out from the component storage 4a, 4b and held by each suction nozzle 51. This component imaging unit 9 is provided on the base 1 and arranged at the same position in the Y direction as the component supply positions 41a of the respective tape feeders 41 arranged in a row in the X direction between the component storages 4a, 4b in a plan view in this embodiment. The component imaging unit 9 is configured to image the components sucked by the head unit 5 from below.

Further, a substrate imaging unit 10 is fixed on an X2 direction side of the head unit 5 and can image the substrate 110 from above at an arbitrary position by the head unit 5 moving in X- and Y-axis directions. The substrate imaging unit 10 images a plurality of differential marks attached to the substrate 110 at a mounting operation position and recognizes the position and direction of the substrate from images.

FIG. 6 is a block diagram showing an electrical configuration of the component mounting apparatus of FIG. 1. The control unit 8 for entirely controlling this component mounting apparatus 100 includes a main controller 81 configured by a computer including a CPU (=Central Processing Unit), a RAM (=Random Access Memory) and the like, and the main controller 81 controls the entire component mounting apparatus 100 by transferring signals to and from each part of the control unit 8 via a bus 83 based on a program and data stored in a storage 82. Specifically, a program 821 stored in the storage 82 is read by the main controller 81. Then, the main controller 81 controls a drive controller 84, an image processor 85 and an input/output controller 86 in accordance with this program 821, whereby the components are successively mounted on the substrate 110 to produce a mounted substrate. Further, if the exchange of the filter 54 becomes necessary, a filter exchange process described next is performed based on the above program 821. Note that reference sign 68 in FIG. 6 denotes a display/operation unit caused to display various pieces of information relating to component mounting and filter exchange by the main controller 81 and used by a user to input various pieces of data and information such as commands to the main controller 81. Particularly, in this embodiment, a message proposing the filter exchange at a timing at which the filter exchange is necessary is displayed on the display/operation unit 68 as described next.

Figure 7:
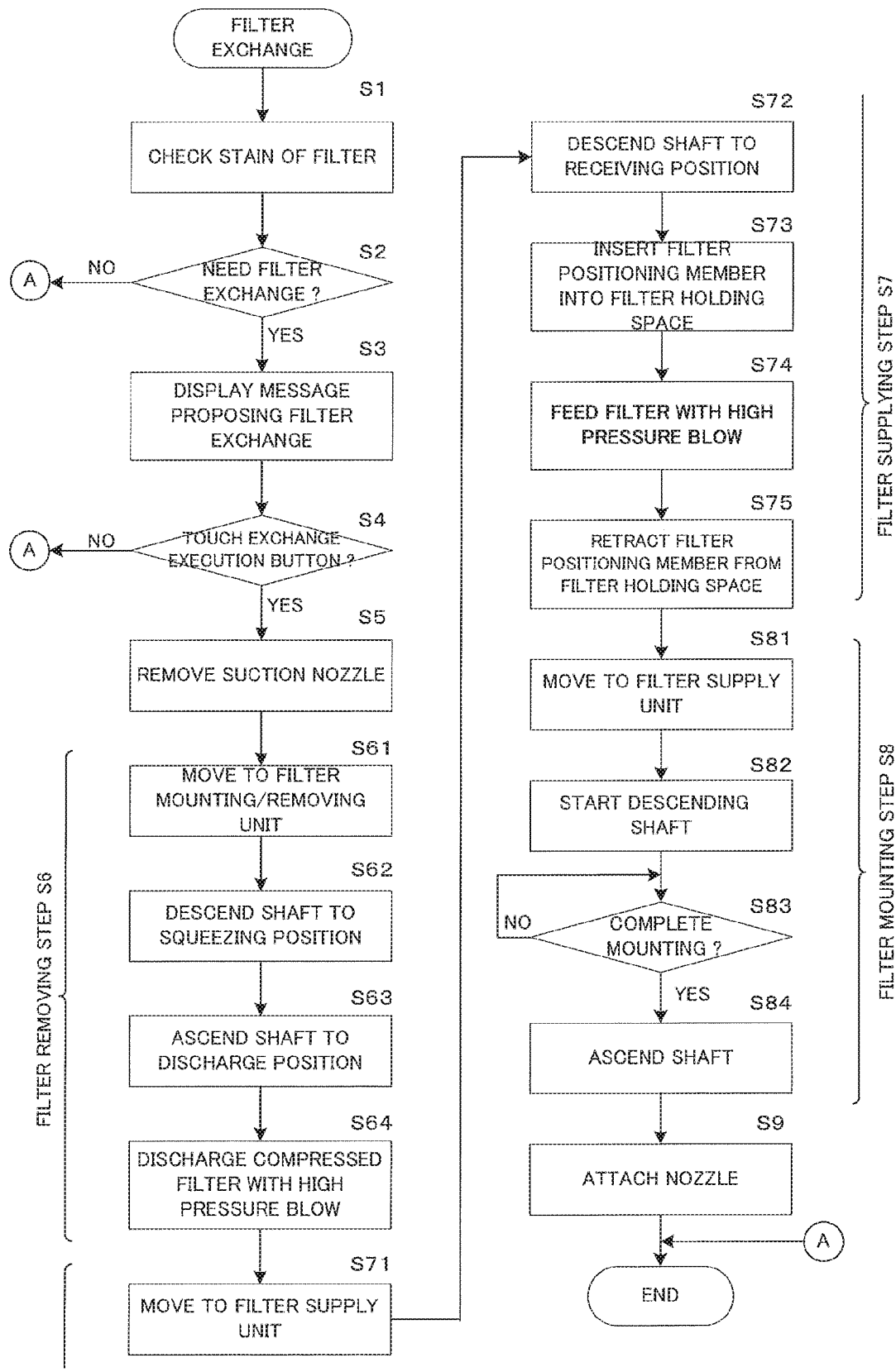
FIG. 7 is a flow chart showing the filter exchange process performed by the component mounting apparatus of FIG. 1.

FIG. 7 is a flow chart showing the filter exchange process performed by the component mounting apparatus of FIG. 1. The filter 54 is desirably exchanged at an appropriate timing according to an operational status of the component mounting apparatus 100. Accordingly, in the component mounting apparatus 100, the control unit 8 performs the filter exchange process by controlling each apparatus unit as described below based on the program 821. The contents of the filter exchange process are described below with reference to FIGS. 7 to 10.

The control unit 8 checks the stain, i.e. a clogged state, of the filters 54 at an appropriate timing, e g immediately after the apparatus is powered on or upon the elapse of a certain operating time (Step S1). For example, a positive pressure or negative pressure may be applied to each component suction head 53 and the stain of the filter 54 may be detected based on whether or not a pressure value measured by the pressure sensor 37 is within a proper range. Further, the stain of the filter 54 may be checked after component suction is performed a fixed number of times by each component suction head 53.

The control unit 8 finishes the filter exchange process and transitions to the normal component mounting operation when determining that the filters 54 are not stained yet in next Step S2. On the other hand, it is determined in Step S2 that the filter 54 has been stained or there is a high possibility that the filter 54 is stained, the control unit 8 displays the message proposing the filter exchange on the display/operation unit 68 (Step S3). Further, the control unit 8 urges user selection by displaying an execution button and a cancel button for filter exchange together with the above message. Here, if the user touches the cancel button displayed on the display/operation unit 68 ("NO" in Step S4), the filter exchange process is finished and a transition is made to the normal component mounting operation. On the other hand, if the user touches the exchange execution button displayed on the display/operation unit 68 ("YES" in Step S4), the head unit 5 is caused to move to the nozzle exchange unit 60. Then, the control unit 8 gives a removal command to the nozzle exchange unit 60. In response to this command, the nozzle exchange unit 60 removes the suction nozzle 51 attached to the component suction head 53 as a target of the filter exchange, thereby exposing the tip part of the nozzle shaft 52 (Step S5). Further, the control unit 8 performs a filter removing step (Step S6), a filter supplying step (Step S7) and a filter mounting step (Step S8) to automatically exchange the filter 54.

Figure 8:
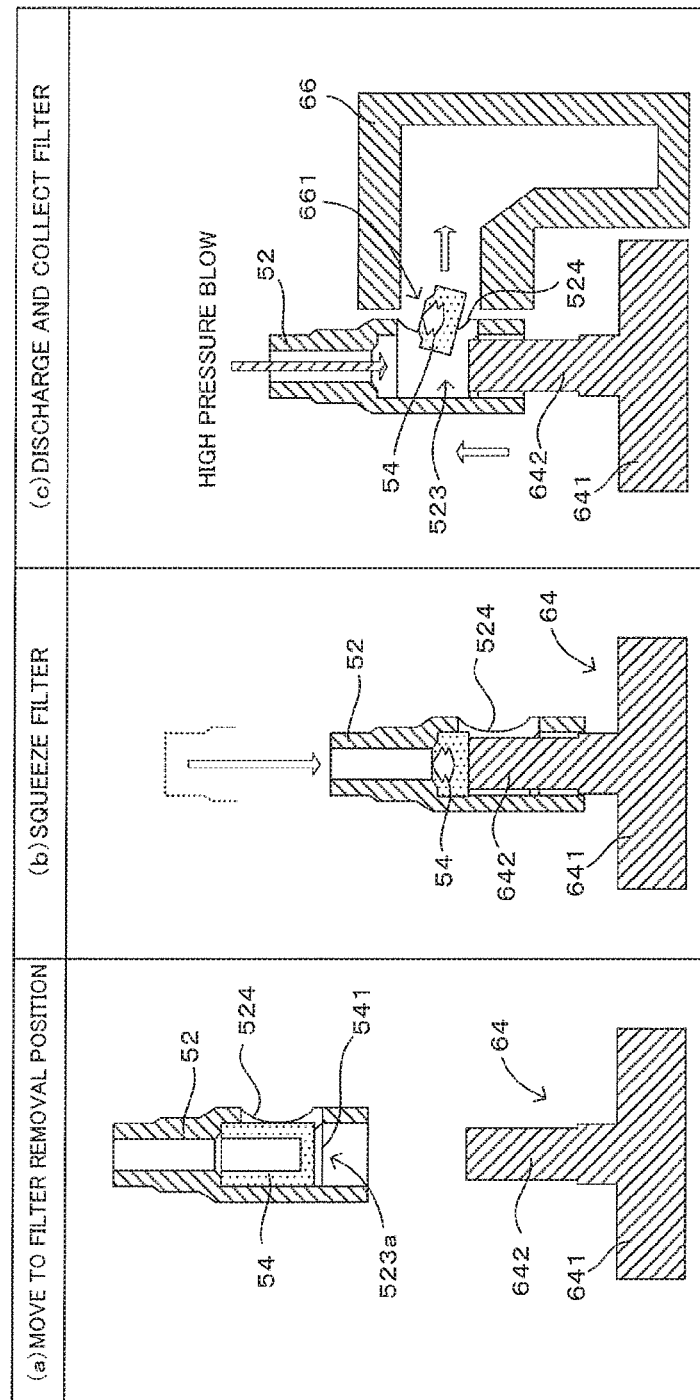
FIG. 8 is a diagram schematically showing the filter removing step.

FIG. 8 is a diagram schematically showing the filter removing step. Note that, in the following description, a case is exclusively described where the filter exchange is necessary for one of the six component suction heads 53 equipped in the head unit 5. However, a basic operation is the same also in the case of performing the filter exchange for a plurality of component suction heads 53 at once.

In this filter removing step (Step S6), the head unit 5 moves from the nozzle exchange unit 60 to the filter mounting/removing unit 64 and the component suction head 53 (component suction head 53 with the nozzle shaft 52 having the exposed tip part) as a target of the filter exchange is positioned above a filter removal position (Step S61). More specifically, as shown in column (a) of FIG. 8, the communication region 523a of the filter holding space 523 is positioned vertically above the cylindrical member 642.

Subsequent to this, this component suction head 53 descends to move the tip part of the nozzle shaft 52 to a squeezing position, whereby the cylindrical member 642 enters the filter holding space 523 via the communication region 523a as shown in column (b) of FIG. 8 (Step S62). The height position of the component suction head 53 in this state is the squeezing position, and the filter 54 is squeezed in the vertical dimension Z by the cylindrical member 542 by a movement to this squeezing position and compressed into a compact shape having a dimension in the vertical dimension Z shorter than the discharge opening 524.

When the squeezing of the filter 54 is completed, the component suction head 53 ascends away from the squeezing position and is positioned at a position where the discharge opening 524 faces the collection opening 661 of the filter disposal box 66, i.e. at a discharge position (Step S63). Then, with the component suction head 53 kept at this discharge position, high-pressure compressed air is supplied to the conduit 521 of the nozzle shaft 52. In this way, the compressed filter 54 is blown at high pressure and discharged to the filter disposal box 66 via the filter discharge opening 524 (Step S64). When the disposal of the filter 54 from the component suction head 53 is completed in this way, the component suction head 53 further ascends, the filter removing step (Step S6) is finished and the next filter supplying step (Step S7) is performed.

Figure 9:
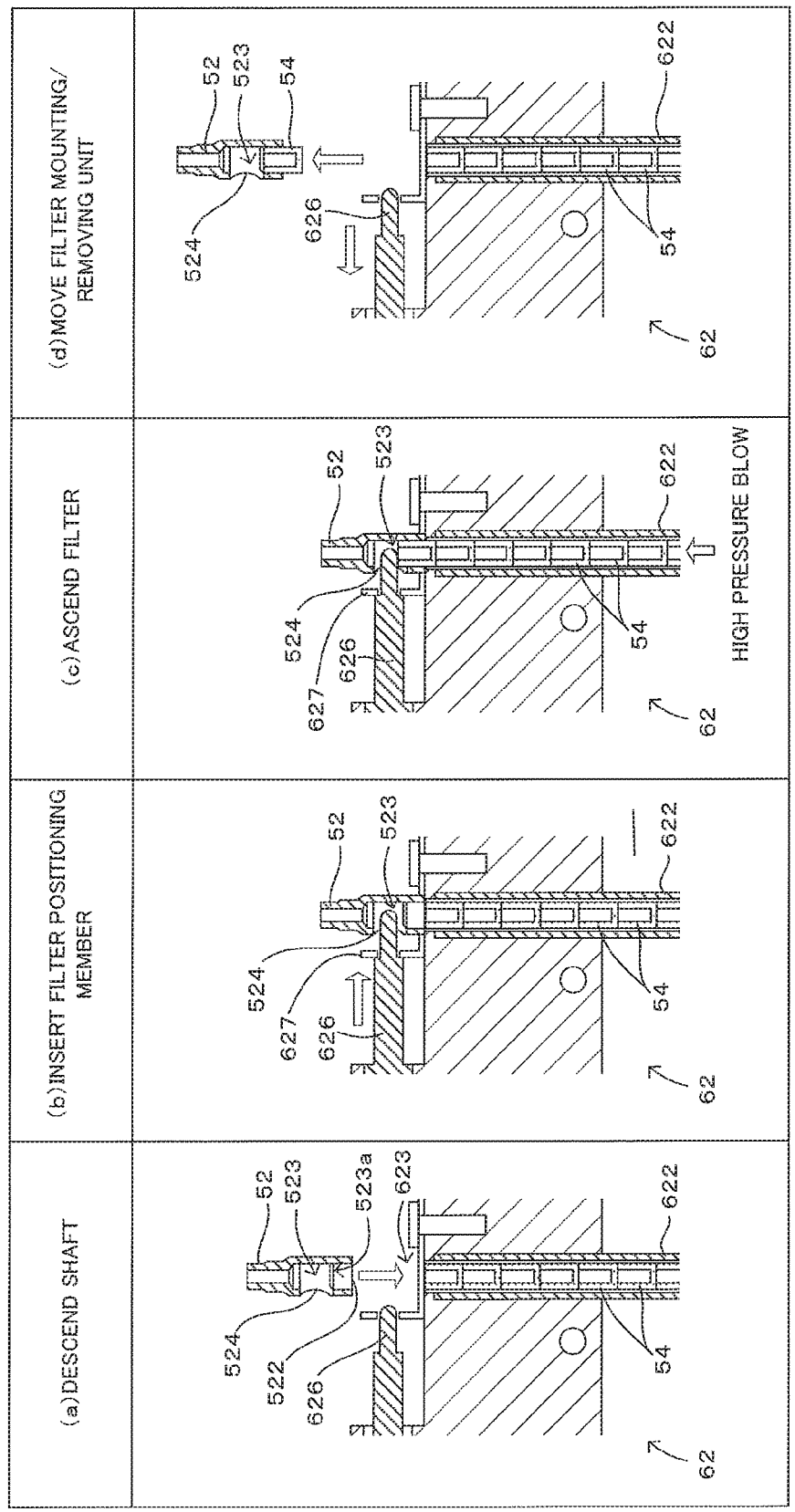
FIG. 9 is a diagram schematically showing the filter supplying step.

FIG. 9 is a diagram schematically showing the filter supplying step. In this filter supplying step (Step S7), as shown in column (a) of FIG. 9, the head unit 5 moves from the filter mounting/removing unit 64 toward the filter supply unit 62 and the component suction head 53 as a target of the filter exchange is positioned above the filter supply position 623 (Step S71). At this point of time, the filter positioning member 626 is retracted from the filter supply position 623. Subsequent to this, the component suction head 53 descends and the opening 522 of the nozzle shaft 52 is arranged to proximately face an upper end opening of the filter supply case 622 (Step S72). In this way, the component suction head 53 can receive a new filter 54 via the opening 522. The height position of the component suction head 53 in this state is a receiving position. Note that, when the component suction head 53 is positioned at the receiving position, the nozzle shaft 52 is adjusted to a state where the filter holding space 523 faces the filter positioning member 626 via the filter discharge opening 524.

Further, when a movement of the component suction head 53 to the receiving position is completed, the air cylinder 625 operates to move the piston forward as shown in column (b) of FIG. 9. Along with this, the tip part of the filter positioning member 626 is inserted into the filter holding space 523 via the filter discharge opening 524 (Step S73).

Subsequently, with an inserted state maintained, the on-off valve 624 is opened in response to an open command from the control unit 8 and high-pressure compressed air is supplied to a lower end opening of the filter supply case 622. In this way, the filters 54 accommodated in the filter supply case 622 are blown at high pressure from below and all the accommodated filters 54 are fed upwardly as shown in column (c) of FIG. 9 (Step S74). Out of these filters 54, the one closest to the filter supply position 623, i.e. the uppermost filter 54, is fed and press-fitted into the filter holding space 523 via the opening 522 and the communication region 523a. At this time, since the filter positioning member 623 is already present in the filter holding space 523, the uppermost filter 54 is partially held.

When the partial holding of the filter 54 is completed in this way, the on-off valve 624 is closed and the supply of the compressed air is stopped in response to a close command from the control unit 8. Subsequent to that, the air cylinder 625 causes the piston to retreat as shown in column (d) of FIG. 9. Along with this, the tip part of the filter positioning member 626 is retracted from the nozzle shaft 52 away from the filter holding space 523 via the filter discharge opening 524 (Step S75). In this way, a movement of the component suction head 53 is enabled.

When the filter 54 is partially held by the component suction head 53 and the supply of the filter 54 to the tip part of the nozzle shaft 52 is completed in this way, the next filter mounting step (Step S8) is performed to press-fit the entire filter 54 into the filter holding space 523.

Figure 10:
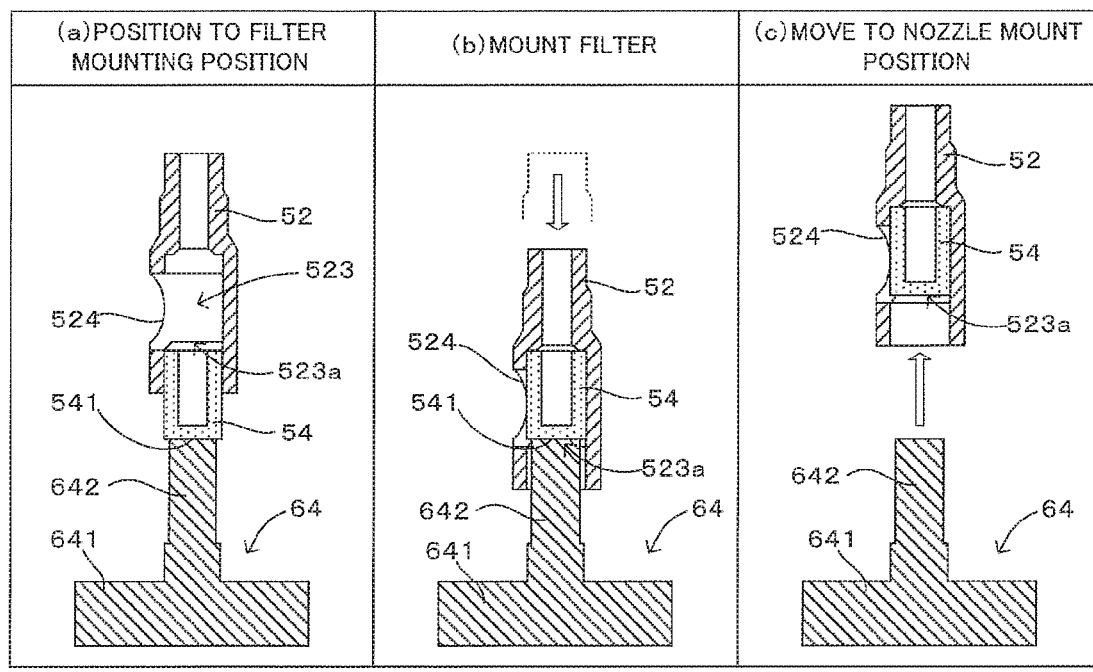
FIG. 10 is a diagram schematically showing the filter mounting step.

FIG. 10 is a diagram schematically showing the filter mounting step. In this filter mounting step (Step S8), the head unit 5 moves again from the filter supply unit 62 toward the filter mounting/removing unit 64 to position the component suction head 53 partially holding the new filter 54 above a filter mounting position (coinciding with the filter removal position in this embodiment) (Step S81). More specifically, the front end surface 541 of the filter 54 in the partially held state is positioned vertically above the cylindrical member 642.

Subsequent to this, this component suction head 53 starts descending (Step S82). Then, when the component suction head 53 descends to a certain extent, the front end surface 541 of the filter 54 comes into contact with the top part of the cylindrical member 642 as shown in column (a) of FIG. 10. The top part of the cylindrical member 642 presses the filter 54 in the upward direction Z1 due to a further descending movement of the component suction head 53, and the filter 54 is press-fitted into the filter holding space 523 and held (column (b) of FIG. 10). When the control unit 8 recognizes in Step S83 that the mounting of the filter 54 into the filter holding space 523 has been completed ("YES" in Step S83), the descent of the component suction head 53 is stopped in response to a stop command from the control unit 8 and, subsequent to that, the component suction head 53 ascends while holding the filter 54 in the filter holding space 523 in response to an ascend command from the control unit 8 (column (c) of FIG. 10) and the filter mounting step is finished.

When the automatic exchange of the filter 54 is completed in this way, the head unit 5 moves from the filter mounting/removing unit 64 to the nozzle exchange unit 60. Then, the suction nozzle 51 is attached to the tip part of the component suction head 53 having the new filter 54 mounted therein by the automatic exchange (Step S9) and the filter exchange process is finished. Note that, thereafter, the components are mounted by the component suction head 53 equipped with the new filter 54 and the suction nozzle 51.

As described above, in the first embodiment of the disclosure, the filter holding space 523 is provided in the tip part of the nozzle shaft 52 and the filter 54 is singly press-fitted and mounted into this filter holding space 523. This filter holding space 523 communicates with the suction nozzle 51 via the opening 522 provided in the tip surface of the nozzle shaft 52, but the communication region 523a of the filter holding space 523 connected to the opening 522 is narrower than the end surface of the filter 54 on the side of the suction nozzle 51, i.e. the front end surface 541. Thus, even if the suction nozzle 51 is detached, for example, as shown in column (b) of FIG. 3, the filter 54 is firmly held in the filter holding space 523 and the drop of the filter 54 from the tip part of the nozzle shaft 52 can be reliably prevented. As just described, since the filter 54 can be singly directly mounted in the tip part of the nozzle shaft 52 and reliably held in this embodiment, the mounting of the filter is simplified. Further, an increase in the diameter of the nozzle shaft 52 associated with the mounting of the filter can be prevented. This can avoid the enlargement of the component suction head 53 associated with the mounting of the filter and enables many component suction heads 53 to be equipped in the head unit 5. As a result, components can be efficiently mounted.

Further, in the above embodiment, the filter 54 is singly held in the filter holding space 523 and the filter 54 is compressed and deformed in that filter holding space 523 to make the volume of the filter 54 smaller than that of the filter holding space 523 and discharged from the filter holding space 523 by high-pressure blowing. In this way, the filter 54 can be easily removed from the nozzle shaft 52.

Further, in the above embodiment, the rear end part of the new filter 54 is inserted into the filter holding space 523 in the filter supply unit 62 and the filter can be supplied to the tip part of the nozzle shaft 52 by a simple configuration. In addition, the filters 54 are supplied one by one from the filter supply case 622 and the filters can be reliably supplied by combining the advancing and retreating movements of the filter positioning member 626 and the high-pressure blowing operation to the filter supply case 622.

Further, since the filter 54 is press-fitted and mounted into the filter holding space 523 in the above embodiment, the filter 54 can be mounted into the nozzle shaft 52 by a very simple operation.

Further, in the component mounting apparatus 100, a dedicated filter removal unit for performing the above filter removing step and a dedicated filter mounting device for performing the above filter mounting step may be separately provided. However, the filter removing step and the filter mounting step are performed by the filter mounting/removing unit 64 in the above embodiment. Thus, the apparatus configuration can be simplified.

Further, although the filter 54 is exchanged by combining three steps, i.e. the filter removing step, the filter supplying step and the filter mounting step in the above embodiment, any of the steps is a simple operation as described above and the filter 54 can be automatically exchanged by combining these steps.

Further, in the above embodiment, the filter 54 is automatically exchanged when the exchange of the filter 54 becomes necessary and an exchange instruction is given from the user ("YES" in Step S4). Thus, a time required for the filter exchange can be shortened and operation efficiency in mounting components can be enhanced as compared to conventional component mounting apparatuses in which the filter exchange has to be manually made by a user. Further, the user's time and effort can be drastically reduced, thereby making the apparatus user-friendly.

B. Second Embodiment

Figure 11:
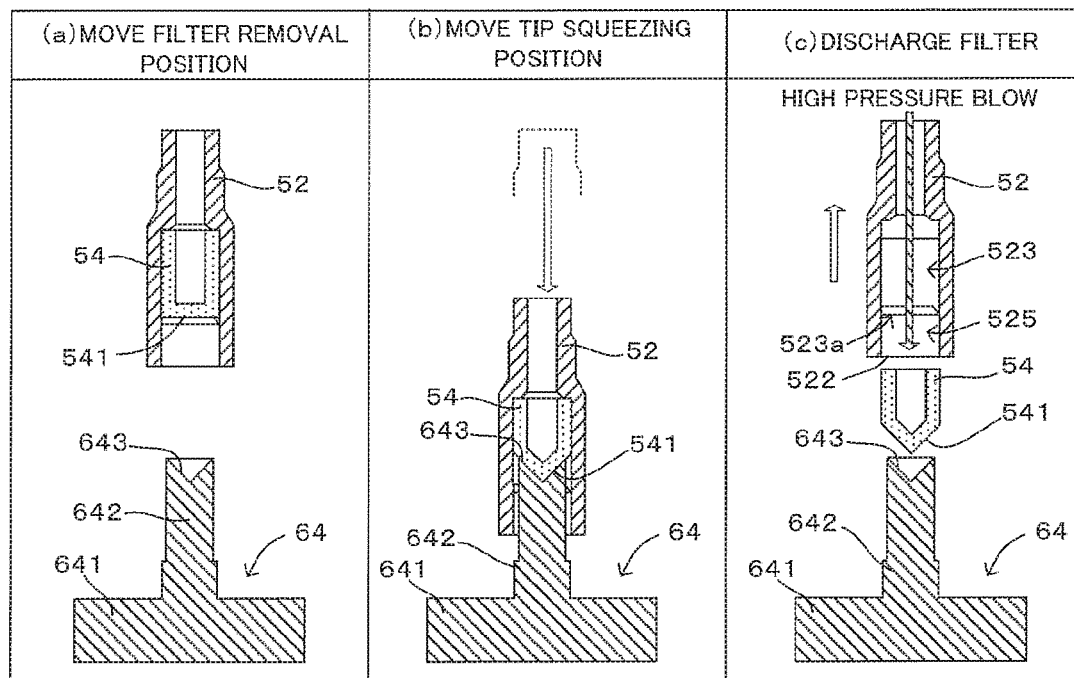
FIG. 11 is a diagram showing the configuration of a filter mounting/removing unit equipped in a second embodiment of the component mounting apparatus according to the disclosure.

FIG. 11 is a diagram showing the configuration of a filter mounting/removing unit equipped in a second embodiment of the component mounting apparatus according to the disclosure. This second embodiment largely differs from the first embodiment in the configuration of the filter mounting/removing unit 64 and the removal method of the filter 54, and the other configurations are as in the first embodiment. Accordingly, the following description is centered on points of difference and the same components are denoted by the same reference signs and not described.

In this second embodiment, a recess 643 is provided in a cylindrical member 642. As shown in FIG. 11, this recess 64 is a pit having an inverted conical shape and formed in a top part of the cylindrical member 642. A filter removing step is performed as follows.

First, similarly to the filter removing step in the first embodiment, a head unit 5 moves from a nozzle exchange unit 60 toward a filter mounting/removing unit 64 and a component suction head 53 (component suction head 53 with a nozzle shaft 52 having an exposed tip part) as a target of filter exchange is positioned above a filter removal position (see column (a) of FIG. 11).

Subsequent to this, this component suction head 53 descends to move the tip part of the nozzle shaft 52 to a tip squeezing position, whereby the cylindrical member 642 enters a filter holding space 523 via a communication region 523*a* as shown in column (b) of FIG. 11. However, in the filter removing step of the second embodiment, the amount of entrance is set to be smaller than in the first embodiment and a movement is stopped when a tip part of the cylindrical member 642 advances from a front end surface 541 of a filter 54 toward a rear end surface side by about ⅓ of the length. Thus, a front end part of the filter 54 is squeezed by the cylindrical member 542 and molded into a shape conforming to the recess 643 of the cylindrical member 642, i.e. into an inverted conical shape, whereas the rear end part remains to have a hollow cylindrical shape. Thus, the filter 54 is finished into a substantially bullet shape.

When the molding of the filter 54 is completed in this way, the component suction head 53 ascends away from the tip squeezing position and high-pressure compressed air is supplied to a conduit 521 of the nozzle shaft 52 and blown to the filter 54 having the substantially bullet shape. At this time, as shown in column (c) of FIG. 11, the filter 54 is discharged toward a base member 641 of the filter mounting/removing unit 64 through the communication region 523*a*, a passage 525 and an opening 522. Note that, to efficiently collect the filter 54 thus discharged, a filter disposal box 66 is arranged vertically below the filter mounting/removing unit 64 with a collection opening 661 facing the base member 641.

As described above, in the second embodiment, the front end part of the filter 54 is finished into the inverted conical shape, thereby making a width of this front end part drastically narrower than an inner diameter D3 (FIG. 3) of the communication region 523*a*. Thus, the filter 54 can be satisfactorily discharged via the communication region 523*a*. Further, since both a discharging direction of the filter 54 and a direction of high-pressure blowing coincide with a direction Z2, the filter 54 can be efficiently discharged. Note that although the ascent of the component suction head 53 and high-pressure blowing are simultaneously started in the above second embodiment, high-pressure blowing may be performed after the ascent of the component suction head 53.

C. Third Embodiment

Figure 12:
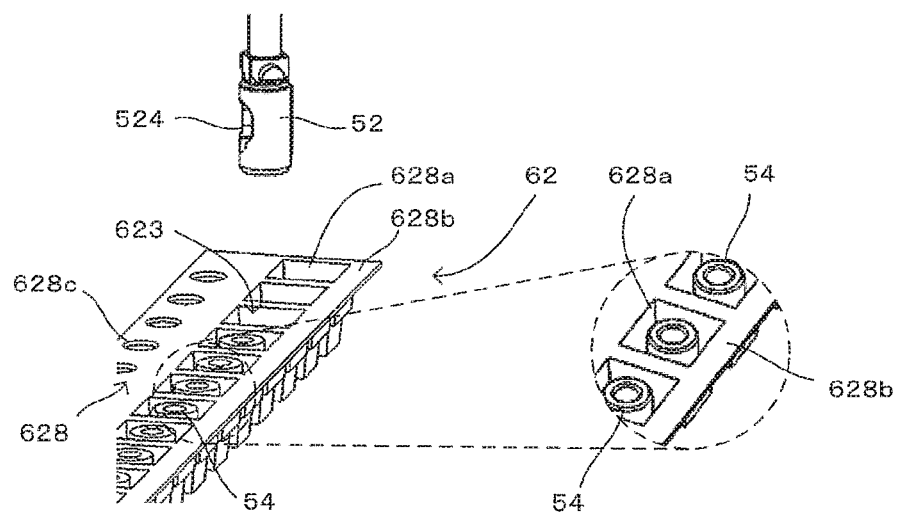
FIG. 12 is a diagram showing the configuration of a filter supply unit equipped in a third embodiment of the component mounting apparatus according to the disclosure.

FIG. 12 is a diagram showing the configuration of a filter supply unit equipped in a third embodiment of the component mounting apparatus according to the disclosure. This third embodiment largely differs from the first embodiment in the configuration of the filter supply unit 62 and the supply method of the filter 54, and the other configurations are as in the first embodiment. Accordingly, the following description is centered on points of difference and the same components are denoted by the same reference signs and not described.

In this third embodiment, a filter 54 for exchange is supplied similarly to the supply of a component by the tape feeder 41. Specifically, in a filter supply unit 62 according to the third embodiment, an embossed tape 628 is used instead of the filter supply case 622. In the embossed tape 628, upward open recesses, i.e. hollow filter accommodating portions 628*a* are formed at fixed intervals in a tape body 628*b* and a filter 54 for exchange is accommodated in each filter accommodating portion 628*a*. Engaging holes 628*c* penetrating in a tape thickness direction are provided at fixed intervals along an edge part on one side of the tape body 628*b*, and are engageable with an unillustrated sprocket for tape feeding.

Here, when the supply of the filter becomes necessary, the sprocket rotates in response to a feed command from a control unit 8, whereby the tape body 628*b* is fed toward a filter supply position 623 and the filter 54 proximate to the filter supply position 623 is positioned at the filter supply position 623. In parallel with this, a head unit 5 moves from a filter mounting/removing unit 64 toward the filter supply unit 62 and a component suction head 53 as a target of filter exchange is positioned above the filter supply position 623. Subsequent to this, after this component suction head 53 descends, a negative pressure is supplied to a nozzle shaft 52, whereby the filter 54 is partially held in a tip part of the nozzle shaft 52.

As described above, in the third embodiment, the filter 54 can be supplied using a mechanism similar to the conventionally known tape feeder 41. That is, a tape feeder can be used in place of the filter supply case 62. Further, the filter supply unit 62 configured as described above can be mounted in the component storage 4*a*, 4*b*.

Note that although a cover tape is not provided for the embossed tape 628 in the above third embodiment, the filter accommodating portions 628a may be covered and protected by a cover tape and, on the other hand, the filter may be supplied by peeling the cover tape immediately before the supply of the filter similarly to the tape for supplying components.

D. Fourth Embodiment

Figures 13, 14:
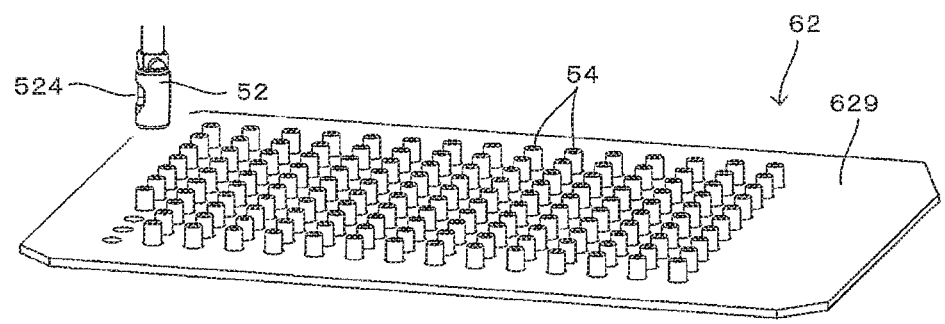
FIG. 13 is a diagram showing the configuration of a filter supply unit equipped in a fourth embodiment of the component mounting apparatus according to the disclosure.
FIG. 14 is a diagram showing the configuration of a filter supply unit equipped in a fifth embodiment of the component mounting apparatus according to the disclosure.

FIG. 13 is a diagram showing the configuration of a filter supply unit equipped in a fourth embodiment of the component mounting apparatus according to the disclosure. This fourth embodiment largely differs from the first embodiment in the configuration of the filter supply unit 62 and the supply method of the filter 54, and the other configurations are as in the first embodiment. Accordingly, the following description is centered on points of difference and the same components are denoted by the same reference signs and not described.

In this fourth embodiment, filters 54 for exchange are held in a matrix on the upper surface of a plate-like matrix plate 629, and this matrix plate 629 functions as a filter supply unit 62. When the supply of the filter becomes necessary, a head unit 5 moves from a filter mounting/removing unit 64 toward the filter supply unit 62 and a component suction head 53 as a target of filter exchange is positioned above one of the filters 54 held on the matrix plate 629. Subsequent to this, after this component suction head 53 descends, a negative pressure is supplied to a nozzle shaft 52, whereby the filter 54 is partially held in a tip part of the nozzle shaft 52.

As described above, in the fourth embodiment, the filter can be supplied by a simple configuration as compared to the filter supply units 62 in the first and third embodiments.

E. Fifth Embodiment

FIG. 14 is a diagram showing the configuration of a filter supply unit equipped in a fifth embodiment of the component mounting apparatus according to the disclosure. This fifth embodiment largely differs from the first embodiment in the configuration of the filter supply unit 62 and the supply method of the filter 54, and the other configurations are as in the first embodiment. Accordingly, the following description is centered on points of difference and the same components are denoted by the same reference signs and not described.

In this fifth embodiment, a plurality of filters 54 are accommodated in a filter supply case 622 and arranged in a row in a vertical direction Z as in the first embodiment. On the other hand, the mechanism for positioning the filter 54 moved upward by high-pressure blowing (air cylinder 625, filter positioning member 626, stopper 627) is omitted. In the filter supply unit 62 configured in this way, the filter 54 is partially held by a suction force due to a negative pressure applied to a component suction head 53 as in the third and fourth embodiments. That is, when the supply of the filter becomes necessary, a head unit 5 moves from a filter mounting/removing unit 64 toward the filter supply unit 62 and the component suction head 53 as a target of filter exchange is positioned above a filter supply position 623. Subsequent to this, after this component suction head 53 descends, a negative pressure is supplied to a nozzle shaft 52, whereby the filter 54 is partially held in a tip part of the nozzle shaft 52 (column (b) of FIG. 14). Thereafter, this component suction head 53 ascends away from the filter supply position 623 (column (c) of FIG. 14).

As described above, in the fifth embodiment, the filter can be supplied by a simpler configuration than in the first embodiment.

F. Sixth Embodiment

Although the hollow cylindrical filters 54 are used in the above first to fifth embodiments, the shape of the filters is not limited to this. For example, the disclosure can be applied to an apparatus using disc-shaped filters 54. A component mounting apparatus 100 using disc-shaped filters 54 is described with reference to the drawings.

Figure 15:
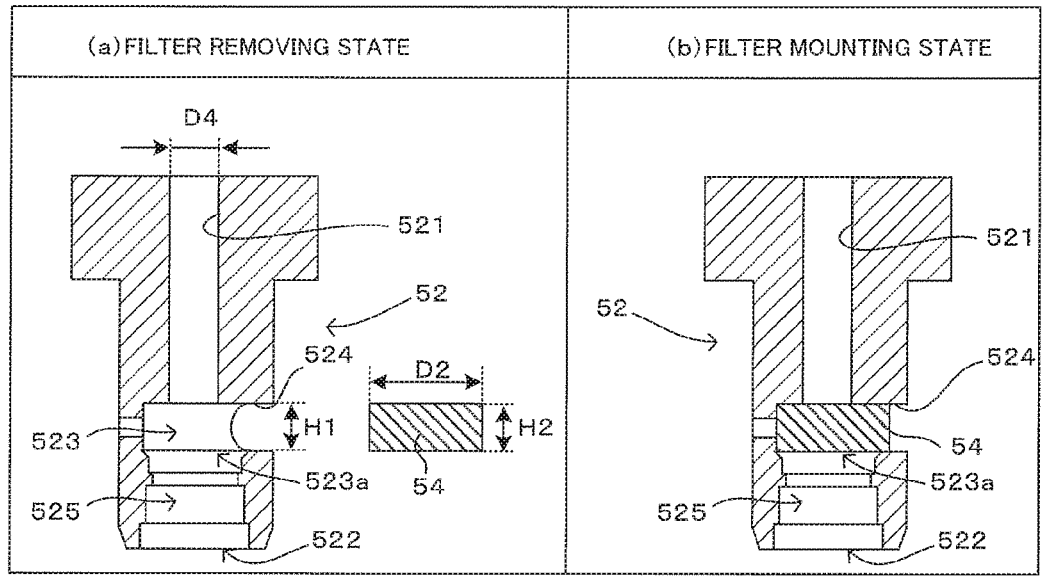
FIG. 15 is a diagram schematically showing a tip part of a nozzle shaft and the structure of a filter in a sixth embodiment of the component mounting apparatus according to the disclosure.

FIG. 15 is a diagram schematically showing a tip part of a nozzle shaft and the structure of a filter in a sixth embodiment of the component mounting apparatus according to the disclosure. A state where a filter 54 is removed from a tip part of a nozzle shaft 52 is shown in column (a) of FIG. 15, whereas a state where the filter 54 is mounted in the tip part of the nozzle shaft 52 is shown in column (b) of FIG. 15.

Also in the sixth embodiment, two openings 522, 524 are provided for the nozzle shaft 52 as in the first to fifth embodiments. Out of these, the opening 524 is formed in a side surface of the tip part of the nozzle shaft 52 and functions as a discharge port. Further, in this embodiment, a dimension H1 of the opening 524 in a vertical direction Z is slightly smaller than a dimension H2 of the filter 54 and the opening 524 also functions as a press-fitting port for press-fitting the filter 54 into a filter holding space 523.

The other opening 522 is formed in the tip surface of the nozzle shaft 52. When a suction nozzle 51 is attached to the nozzle shaft 52, this opening 522 functions to allow communication between a nozzle holder 511 of the suction nozzle 51 and the filter holding space 523. Further, the opening 522 communicates with the filter holding space 523 via a passage 525 extending in the Z direction. Note that a dimensional relationship of the communication region 523a of the filter holding space 523, the opening 522 and the passage 525 is as in the first to fifth embodiments. Thus, when the filter 54 is press-fitted into the filter holding space 523 via the opening 524 as described above, a peripheral edge part of the lower surface of the filter 54 is locked by a peripheral edge part of the communication region 523a and the filter 54 is firmly held in the filter holding space 523 also when a positive pressure is supplied. Further, also on a Z1 direction side of the filter holding space 523, an inner diameter D4 of a communication region 523b connected to the passage 521 is slightly smaller than an outer diameter D2 of the filter 54. Thus, a peripheral edge part of the upper surface of the filter 54 is locked by a peripheral edge part of the communication region 523b and the filter 54 is firmly held in the filter holding space 523 also when a negative pressure is supplied.

Figure 16:
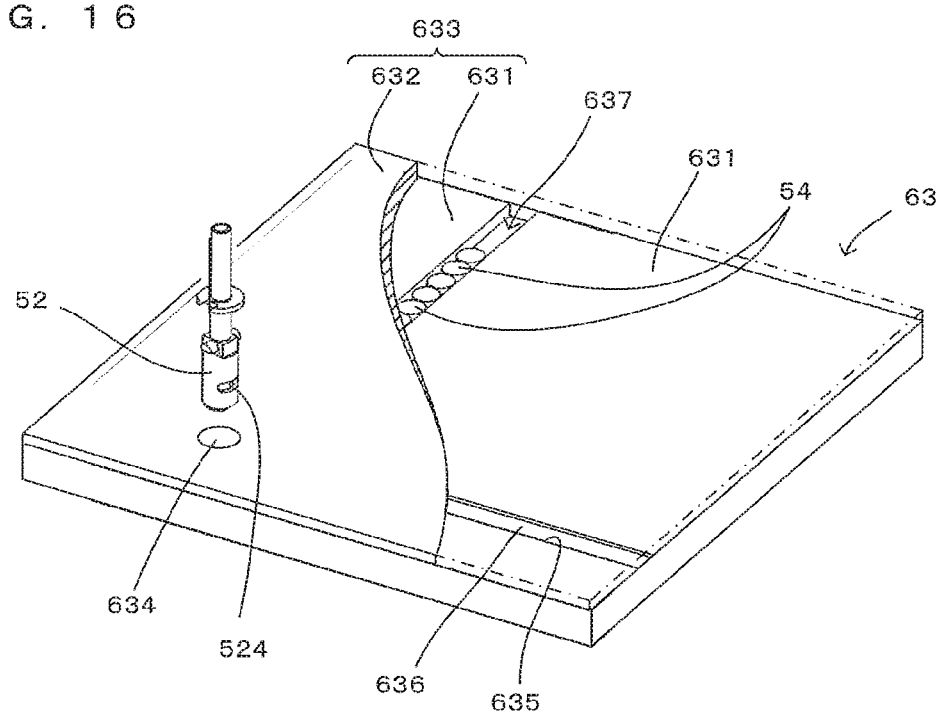
FIG. 16 is a diagram showing the configuration of the filter supplying/mounting unit equipped in the sixth embodiment of the component mounting apparatus according to the disclosure.

In the sixth embodiment, the filter 54 is supplied via the opening 524 and further press-fitted into the filter holding space 523 as described above, whereby the filter 54 is mounted into the tip part of the nozzle shaft 52. Thus, in the component mounting apparatus 100 according to the sixth embodiment, a filter supplying/mounting unit 63 shown in FIG. 16 is provided in place of the filter supply unit 62 and a filter mounting/removing unit 64 is dedicated to squeeze the filter 54. Note that the other configurations are as in the first embodiment. Thus, the following description is centered on points of difference from the first embodiment and the same components are denoted by the same reference signs and not described.

Figure 17:
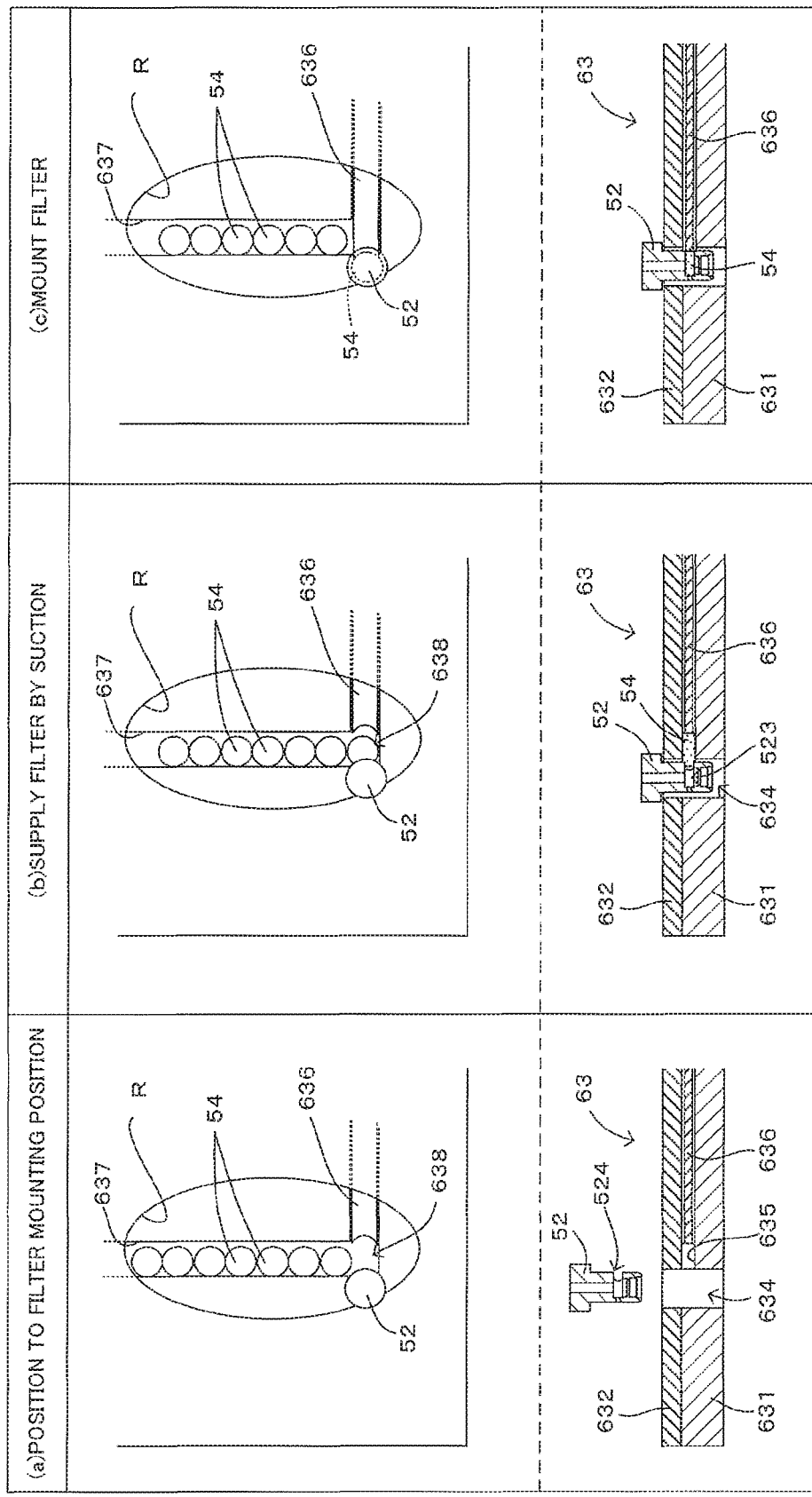
FIG. 17 is a diagram schematically showing a filter supplying/mounting operation by the filter supplying/mounting unit of FIG. 16.

FIG. 16 is a diagram showing the configuration of the filter supplying/mounting unit equipped in the sixth embodiment of the component mounting apparatus according to the disclosure. FIG. 17 is a diagram schematically showing a filter supplying/mounting operation by the filter supplying/mounting unit of FIG. 16. Note that elliptical regions R in upper parts of FIG. 17 are regions showing an internal structure of the filter supplying/mounting unit 63 by partially cutting off a top plate.

As shown in FIG. 16, the filter supplying/mounting unit 63 includes a body unit 633 formed by laminating a base plate 631 and a top plate 632. A through hole is provided in each of the base plate 631 and the top plate 632. The base plate 631 and the top plate 632 are joined with those through holes overlapped to match in a vertical direction Z, thereby configuring a hollow work space 634 into which the tip part of the nozzle shaft 52 is insertable.

A groove portion 635 extends to communicate with this work space 634 in a horizontal direction in an upper surface part of the base plate 631. A bar-shaped pushing member 636 is provided in this groove portion 635 slidably in a longitudinal direction of the groove portion 635. Further, another groove portion 637 extends in a horizontal direction perpendicular to the groove portion 635 in the upper surface part of the base plate 631 and is, as shown in FIG. 17, connected to the groove portion 635 before the work space 634 to form an intersection region 638. A width of this groove portion 637 is slightly larger than an outer diameter of the filters 54, so that the filters 54 can be guided to the intersection region 638 while being arranged in a row.

As shown in FIG. 17, an end part of the pushing member 636 on the work space side is finished into an arc shape having a radius of curvature slightly larger than that of the filters 54. Further, although not shown in FIG. 17, a reciprocating drive mechanism is connected to the pushing member 636. When a forward movement command is received from a control unit 8, the pushing member 636 is moved toward the work space 634. In this way, the filter 54 present in the intersection region 638 is pushed out into the work space 634 by the pushing member 636. On the other hand, if a return movement command is received from the control unit 8, the pushing member 636 is separated from the work space 634.

The filter supplying/mounting unit 63 thus configured performs a filter supplying step and a filter mounting step by operating as follows. Specifically, each part of the apparatus is controlled by the control unit 8 to perform the following operation. First, a head unit 5 moves toward the filter supplying/mounting unit 63 to position a component suction head 53 as a target of filter exchange above the work space 634 (see column (a) of FIG. 17).

Subsequent to this, the component suction head 53 descends with the opening 524 of the nozzle shaft 52 facing the groove portion 637 to insert the tip part of the nozzle shaft 52 into the work space 634. In this way, as shown in column (b) of FIG. 17, the filter holding space 523 proximately faces the intersection region 638 via the opening 524 and can receive a new filter 54 via the opening 524. In this state, a negative pressure is supplied to the component suction head 53 and the filter 54 in the groove portion 637 is pulled toward the intersection region 638. This causes the filter 54 closest to the intersection region 638 to be supplied between the filter holding space 523 and the pushing member 636 and a part of the filter 54 is inserted into the filter holding space 523 (column (b) of FIG. 17). In this way, the filter 54 is supplied (filter supplying step).

The pushing member 636 is caused to make a return movement by the reciprocating drive mechanism, thereby pressing the filter 54 to the opening 524 from the intersection region 638 and press-fitting the filter 54 into the filter holding space 523. In this way, the mounting of the filter 54 into the nozzle shaft 52 is completed (filter mounting step). Then, the pushing member 636 is caused to make a forward movement by the reciprocating drive mechanism, thereby being retracted from the intersection region 638.

In the component mounting apparatus 100 thus configured, when the exchange of the filter 54 becomes necessary and an exchange instruction is given from a user ("YES" in Step S4), the filter supplying step and the filter mounting step by the filter supplying/mounting unit 63 are performed after the filter removing step is performed as in the first embodiment. In this way, the filter 54 is automatically exchanged also in the sixth embodiment.

As described above, the sixth embodiment differs from the first embodiment in that the disc-shaped filters 54 are handled, but the filter holding space 523 is provided in the tip part of the nozzle shaft 52 and the filter 54 is singly press-fitted and mounted into this filter holding space 523. Further, the filter removing step is exactly the same. Thus, functions and effects similar to those of the first embodiment are obtained.

Further, since the filter supplying step and the filter mounting step are successively performed by the filter supplying/mounting unit 63 in the sixth embodiment, a time required for filter exchange, i.e. a tack time for filter exchange can be made shorter than in the first embodiment.

G. Seventh Embodiment

Figure 18:
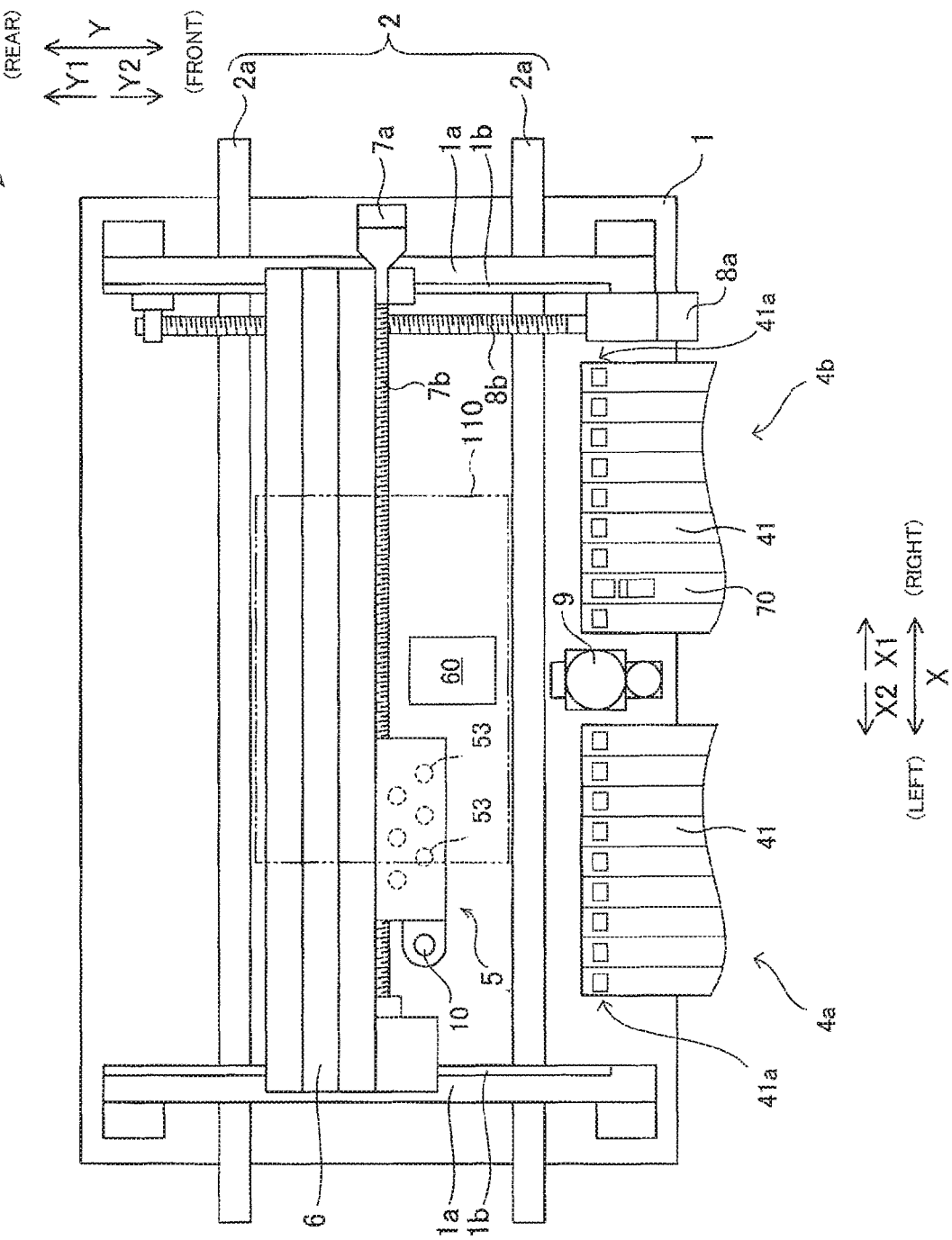
FIG. 18 is a plan view showing a seventh embodiment of the component mounting apparatus according to the disclosure.
Figure 19A:
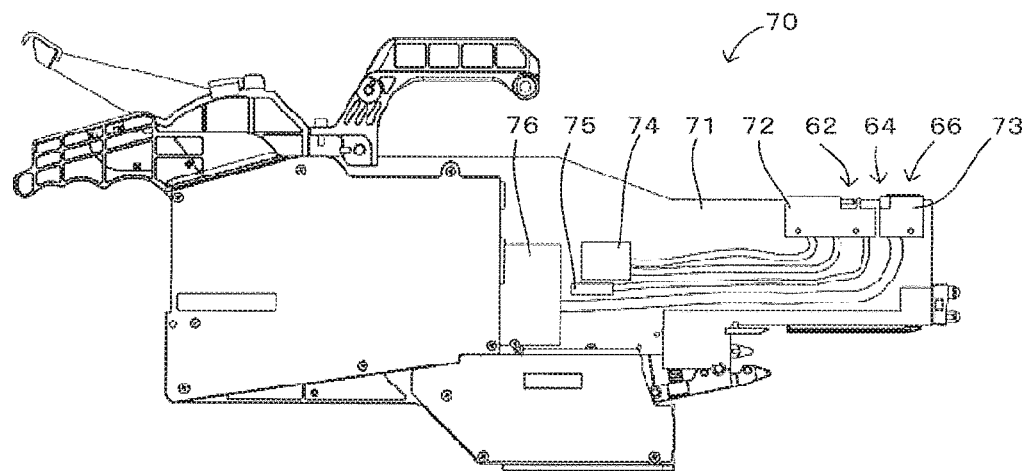
FIG. 19A is a diagram showing an overall configuration of a filter exchange device equipped in the component mounting apparatus of FIG. 18.
Figure 19B:
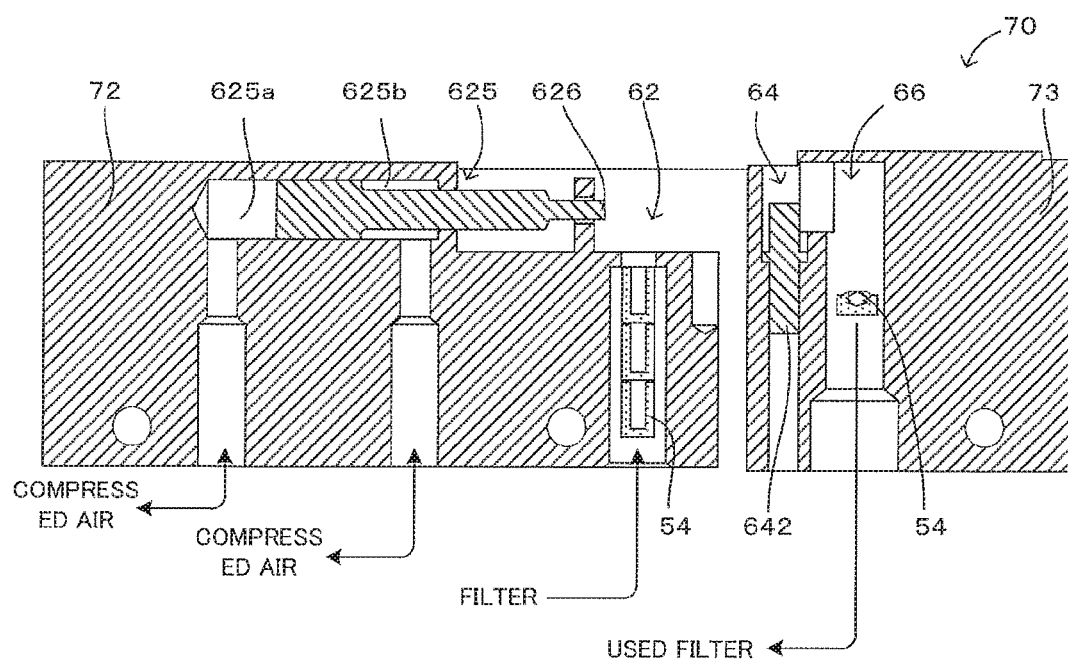
FIG. 19B is a partial sectional view of the filter exchange device of FIG. 19A.

FIG. 18 is a plan view showing a seventh embodiment of the component mounting apparatus according to the disclosure. Further, FIG. 19A is a diagram showing an overall configuration of a filter exchange device equipped in the component mounting apparatus of FIG. 18. FIG. 19B is a partial sectional view of the filter exchange device of FIG. 19A. This seventh embodiment largely differs from the first embodiment in that the filter supply unit 62, the filter mounting/removing unit 64 and the filter disposal box 66 are integrated into a filter exchange device 70 and that this filter exchange device 70 is removably mounted in a component storage 4a, 4b, and the other configurations are as in the first embodiment. Thus, the following description is centered on points of difference from the first embodiment and the same components are denoted by the same reference signs and not described.

The filter exchange device 70 includes a housing 71 configured to be removably mountable in a component storage 4a, 4b. A feeder body of the tape feeder 41 may be, for example, used as this housing 71. As shown in FIG. 19A, two blocks 72, 73 are fixed on a front side of the housing 71, i.e. on a side near a head unit 5. As shown in FIG. 19B, one block 72 is provided with a filter supply unit 62. Further, the other block 73 is provided with a filter mounting/removing unit 64 and a filter disposal box 66.

Further, a compressed air supply unit 74, a filter supply unit 75 and a filter collecting unit 76 are fixed in a central part of the housing 71. The compressed air supply unit 74 performs a filter supplying operation by supplying compressed air to the filter supply unit 62. In this embodiment, a double-action air cylinder 645 is used as a drive source for a filter positioning member 626. A left space 625a formed on a left end side of the air cylinder 625 and a center space 625b formed in a laterally intermediate part are connected to the compressed air supply unit 74. By supplying compressed air from the compressed air supply unit 74 to the left space 625*a*, the filter positioning member 626 advances to a position above the filter supply unit 62. On the other hand, by supplying the compressed air from the compressed air supply unit 74 to the center space 625*b*, the filter positioning member 626 retreats to be retracted from the position above the filter supply unit 62. Further, the filter supply unit 75 supplies filters 54 for exchange to the filter supply unit 62 for filter replenishment. Furthermore, the filter supply unit 62 gives a negative pressure to the filter disposal box 66 to collect the used filter 54.

As described above, in the seventh embodiment, the filter supply unit 62, the filter mounting/removing unit 64 and the filter disposal box 66 are integrated to obtain the compact filter exchange device 70 and the component mounting apparatus 100 can be reduced in size.

Further, the filter exchange device 70 is removably mounted in the component storage 4*a*, 4*b* similarly to the tape feeders 41. That is, by handling the filters 54 similarly to the components, the filters can be automatically exchanged merely by mounting the filter exchange device 70 in the component storage 4*a*, 4*b* similarly to the tape feeders without remodeling component mounting apparatuses conventionally widely in use. By using the filter exchange device 70 in this way, functional improvements of component mounting apparatuses already in operation can be easily realized.

H. Miscellaneous

Note that the disclosure is not limited to the above embodiments and various changes other than the aforementioned ones can be made without departing from the gist of the disclosure. For example, although the compressed filter 54 is discharged by high-pressure blowing after the filter 54 is compressed in the above first to seventh embodiments, the filter 54 may be discharged by high-pressure blowing without being compressed.

Further, although the filter 54 to be mounted into the tip part of the nozzle shaft 52 has a hollow cylindrical shape or a disc shape in the above embodiments, the shape of the filter is not limited to these and the disclosure is applicable to filters in general mountable in component suction heads.

Further, although the filter mounting/removing unit 64 is used as both the filter mounting unit and the filter removal unit in the above first to fifth and seventh embodiments, the filter mounting unit and the filter removal unit may be separately provided.

Further, although the filter holding structure, the filter removal method, the filter supply method, the filter exchange method and the filter exchange device are applied to the component mounting apparatus in the above embodiments, the application target of those is not limited to the component mounting apparatus and application to apparatuses in general using component suction head(s) such as component inspection apparatuses is possible.

As described above, in the above embodiments, the Z direction corresponds to an "external fitting direction" of the disclosure, and the length L of the external fitting area of the suction nozzle 51 on the nozzle shaft 52 corresponds to an "external fitting length". Further, the front end surface 541 of the filter 54 corresponds to an "end surface of the filter on the suction nozzle side".

As the specific embodiments have been illustrated and described above, the disclosure may be, for example, such that the rear end part of the suction nozzle is externally fitted and mounted on the tip part of the nozzle shaft, whereby the component suction head can be shortened. Particularly, it is effective in shortening the component suction head to make a length of the filter in the external fitting direction of the rear end part of the suction nozzle on the tip part of the nozzle shaft shorter than the external fitting length of the rear end part of the suction nozzle on the tip part of the nozzle shaft.

This disclosure can be applied to filter holding techniques in general for holding a filter inside a component suction head for sucking a component.

What is claimed is:

1. A filter holding structure for holding a filter in a component suction head, the filter holding structure comprising:
    a nozzle shaft configured to be detachably connected to a suction nozzle, the nozzle shaft including a tip part that defines a filter holding space configured to hold the filter, an opening in the nozzle shaft configured to allow communication between the filter holding space and the suction nozzle, and a communication region in the nozzle shaft between the filter holding space and the opening, wherein
    the communication region is narrower than an end surface of the filter such that, when the filter is inserted through the opening into the filter holding space, the filter is elastically deformed as it passes through the communication region and is retained within the filter holding space by the communication region.

2. The filter holding structure according to claim 1, wherein:
    when the nozzle shaft is detachably connected to the suction nozzle, a rear end part of the suction nozzle is externally fitted on the tip part of the nozzle shaft.

3. The filter holding structure according to claim 2, wherein:
    a length of the filter holding space in a direction of the insertion of the filter into the filter holding space is shorter than an external fitting length of the rear end part of the suction nozzle on the tip part of the nozzle shaft.

4. A component mounting apparatus for holding and mounting a component on a substrate by a component suction head, the component mounting apparatus comprising:
    a nozzle shaft configured to be detachably connected to a suction nozzle, the nozzle shaft including a tip part that defines a filter holding space configured to hold a filter, an opening in the nozzle shaft configured to allow communication between the filter holding space and the suction nozzle, and a communication region in the nozzle shaft between the filter holding space and the opening, wherein
    the communication region is narrower than an end surface of the filter such that, when the filter is inserted through the opening into the filter holding space, the filter is elastically deformed as it passes through the communication region and is retained within the filter holding space by the communication region.

5. The component mounting apparatus according to claim 4, wherein:
    when the nozzle shaft is detachably connected to the suction nozzle, a rear end part of the suction nozzle is externally fitted on the tip part of the nozzle shaft.

6. The component mounting apparatus according to claim 5, wherein:

a length of the filter holding space in a direction of the insertion of the filter into the filter holding space is shorter than an external fitting length of the rear end part of the suction nozzle on the tip part of the nozzle shaft.

\* \* \* \* \*